United States Patent
Lowes et al.

(10) Patent No.: US 9,818,919 B2
(45) Date of Patent: Nov. 14, 2017

(54) LED PACKAGE WITH MULTIPLE ELEMENT LIGHT SOURCE AND ENCAPSULANT HAVING PLANAR SURFACES

(71) Applicant: CREE, INC., Durham, NC (US)

(72) Inventors: Theodore Lowes, Lompoc, CA (US); Eric J. Tarsa, Goleta, CA (US); Sten Heikman, Goleta, CA (US); Bernd Keller, Santa Barbara, CA (US); Jesse Reiherzer, Raleigh, NC (US); Hormoz Benjamin, Moorpark, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 13/649,067

(22) Filed: Oct. 10, 2012

(65) Prior Publication Data
US 2013/0328073 A1 Dec. 12, 2013

Related U.S. Application Data

(60) Provisional application No. 61/658,271, filed on Jun. 11, 2012, provisional application No. 61/660,231, (Continued)

(51) Int. Cl.
*H01L 33/00* (2010.01)
*H01L 33/54* (2010.01)
(Continued)

(52) U.S. Cl.
CPC .............. *H01L 33/54* (2013.01); *F21V 9/00* (2013.01); *H01L 33/502* (2013.01);
(Continued)

(58) Field of Classification Search
CPC ........... H01L 2933/0091; H01L 33/502; H01L 33/504
(Continued)

(56) References Cited

U.S. PATENT DOCUMENTS

| 4,013,916 A | 3/1977 | Brown |
| 4,143,394 A | 3/1979 | Schoberl ................. 257/680 |

(Continued)

FOREIGN PATENT DOCUMENTS

| CN | 1380703 | 11/2002 |
| CN | 1776506 | 5/2006 |

(Continued)

OTHER PUBLICATIONS

International Search Report from PCT/US2013/044277, dated Jan. 7, 2014.
(Continued)

*Primary Examiner* — Allen Parker
*Assistant Examiner* — Frederick B Hargrove
(74) *Attorney, Agent, or Firm* — Koppel, Patrick, Heybl & Philpott

(57) ABSTRACT

LED packages are disclosed that are compact and efficiently emit light, and can comprise encapsulants with planar surfaces that refract and/or reflect light within the package encapsulant. The packages can comprise a submount with a plurality of LEDs, which emit different colors of light, and a blanket conversion material layer on the LEDs and the submount. The encapsulant can be on the submount, over the LEDs, and light reflected within the encapsulant will reach the conversion material to be absorbed and emitted omnidirectionally. Reflected light can now escape the encapsulant, allowing for efficient emission and a broader emission profile, when compared to conventional packages with hemispheric encapsulants or lenses. The LED package can have a higher chip area to LED package area ratio. By using an encapsulant with planar surfaces, the LED package provides unique dimensional relationships between the features and LED package ratios, enabling more flexibility with different applications.

94 Claims, 13 Drawing Sheets

Related U.S. Application Data filed on Jun. 15, 2012, provisional application No. 61/696,205, filed on Sep. 2, 2012.

(51) Int. Cl.
*H01L 33/50* (2010.01)
*F21V 9/00* (2015.01)
*H01L 33/60* (2010.01)

(52) U.S. Cl.
CPC ............ *H01L 33/504* (2013.01); *H01L 33/60* (2013.01); *H01L 33/505* (2013.01); *H01L 2224/48091* (2013.01); *H01L 2224/48247* (2013.01); *H01L 2224/73265* (2013.01); *H01L 2924/181* (2013.01)

(58) Field of Classification Search
USPC ..................................... 257/79–103; 438/29
See application file for complete search history.

(56) References Cited

U.S. PATENT DOCUMENTS

| | | |
|---|---|---|
| 6,350,041 B1 | 2/2002 | Tarsa et al. |
| 6,521,915 B2 | 2/2003 | Odaki et al. .................... 257/98 |
| 6,686,675 B2 | 2/2004 | McNulty et al. ............. 313/112 |
| 7,009,343 B2 | 3/2006 | Lim et al. ...................... 315/150 |
| 7,213,940 B1 | 5/2007 | Van de Ven et al. |
| 7,253,448 B2 | 8/2007 | Roberts et al. |
| 7,614,759 B2 | 11/2009 | Negley |
| 7,762,692 B2 | 7/2010 | Lai et al. |
| D646,235 S | 10/2011 | Kuwaharada |
| D650,342 S | 12/2011 | Kuwaharada ................ D13/180 |
| 8,450,147 B2 | 5/2013 | Chandra ....................... 438/106 |
| 2002/0163302 A1 | 11/2002 | Nitta et al. |
| 2004/0130880 A1 | 7/2004 | Min et al. |
| 2004/0217364 A1* | 11/2004 | Tarsa et al. ..................... 257/89 |
| 2004/0218390 A1* | 11/2004 | Holman et al. ............... 362/245 |
| 2004/0227149 A1 | 11/2004 | Ibbetson et al. ............. 257/100 |
| 2005/0073840 A1 | 4/2005 | Chou et al. |
| 2005/0093005 A1 | 5/2005 | Ruhnau et al. ................. 257/79 |
| 2005/0173708 A1 | 8/2005 | Suehiro et al. |
| 2006/0049421 A1 | 3/2006 | Suehiro et al. |
| 2006/0060882 A1 | 3/2006 | Ohe et al. |
| 2006/0097245 A1* | 5/2006 | Aanegola ............ H01L 25/0753 257/26 |
| 2006/0097385 A1 | 5/2006 | Negley .......................... 257/722 |
| 2006/0124946 A1 | 6/2006 | Fujita |
| 2006/0138437 A1 | 6/2006 | Huang ............................. 257/98 |
| 2006/0186431 A1 | 8/2006 | Miki ............................. 257/100 |
| 2006/0273337 A1 | 12/2006 | Han et al. |
| 2007/0029569 A1 | 2/2007 | Andrews ......................... 257/99 |
| 2007/0096131 A1* | 5/2007 | Chandra ............. H01L 33/505 257/99 |
| 2007/0108463 A1 | 5/2007 | Chua et al. |
| 2007/0145397 A1 | 6/2007 | DenBaars |
| 2007/0152231 A1 | 7/2007 | Destain |
| 2007/0201225 A1 | 8/2007 | Holder et al. ................ 362/227 |
| 2007/0262339 A1* | 11/2007 | Hussell .............. C09K 11/7731 257/99 |
| 2007/0284589 A1 | 12/2007 | Ng .................................. 257/79 |
| 2008/0006839 A1 | 1/2008 | Lin ................................ 257/98 |
| 2008/0012036 A1 | 1/2008 | Loh ................................ 257/99 |
| 2009/0050907 A1* | 2/2009 | Yuan et al. ..................... 257/88 |
| 2009/0057699 A1 | 3/2009 | Basin |
| 2009/0091045 A1 | 4/2009 | Tanikawa et al. ............ 257/791 |
| 2009/0262515 A1* | 10/2009 | Lee et al. ....................... 362/84 |
| 2009/0272995 A1 | 11/2009 | Ito et al. |
| 2009/0278147 A1 | 11/2009 | Suzuki |
| 2010/0128191 A1 | 5/2010 | Park et al. ...................... 257/88 |
| 2010/0140633 A1 | 6/2010 | Emerson |
| 2010/0140634 A1 | 6/2010 | Van de Ven .................... 257/88 |
| 2010/0155763 A1 | 6/2010 | Donofrio et al. |
| 2010/0252851 A1 | 10/2010 | Emerson et al. |
| 2010/0276712 A1 | 11/2010 | Shaikevitch ................... 257/98 |
| 2010/0291374 A1 | 11/2010 | Akarsu ........................ 428/328 |
| 2011/0001151 A1 | 1/2011 | Le Toquin ...................... 257/98 |
| 2011/0031527 A1 | 2/2011 | Kotani et al. |
| 2011/0121331 A1 | 5/2011 | Simonian et al. ............. 257/98 |
| 2011/0140289 A1 | 6/2011 | Shiobara et al. ............. 257/789 |
| 2011/0156061 A1 | 6/2011 | Wang et al. |
| 2011/0215345 A1 | 9/2011 | Tarsa et al. ..................... 257/88 |
| 2011/0220920 A1* | 9/2011 | Collins et al. .................. 257/88 |
| 2011/0221330 A1 | 9/2011 | Negley et al. |
| 2011/0228514 A1 | 9/2011 | Tong et al. ...................... 362/84 |
| 2011/0279054 A1 | 11/2011 | Katona ......................... 315/291 |
| 2011/0291131 A1 | 12/2011 | Ito |
| 2011/0316006 A1 | 12/2011 | Xu |
| 2012/0043563 A1 | 2/2012 | Ibbetson ......................... 257/88 |
| 2012/0061703 A1 | 3/2012 | Kobayashi |
| 2012/0062821 A1 | 3/2012 | Takeuchi et al. |
| 2012/0068198 A1* | 3/2012 | Andrews et al. ............... 257/88 |
| 2012/0087124 A1 | 4/2012 | Ravillisetty .................. 362/235 |
| 2012/0112220 A1 | 5/2012 | West |
| 2012/0119234 A1 | 5/2012 | Shioi |
| 2012/0193651 A1 | 8/2012 | Edmond et al. ................ 257/88 |
| 2012/0193662 A1 | 8/2012 | Donofrio ........................ 257/98 |
| 2012/0248483 A1 | 10/2012 | Beppu ............................ 257/98 |
| 2013/0020600 A1 | 1/2013 | Yoo ................................ 257/98 |
| 2013/0105835 A1* | 5/2013 | Wu .................. H01L 25/0753 257/89 |
| 2013/0140580 A1* | 6/2013 | Wirth .................. H01L 25/0753 257/76 |
| 2013/0300285 A1 | 11/2013 | Ito |
| 2013/0334559 A1 | 12/2013 | Vdovin et al. ................. 257/98 |
| 2014/0027795 A1 | 1/2014 | Reiherzer et al. .............. 257/88 |

FOREIGN PATENT DOCUMENTS

| | | | |
|---|---|---|---|
| CN | 1802756 | 7/2006 | |
| DE | WO 2012016850 A1 * | 2/2012 | ......... H01L 25/0753 |
| EP | 0441622 A1 | 2/1991 | |
| EP | 1529807 A2 | 5/2005 | |
| EP | 2042528 A1 | 9/2007 | |
| EP | 2113949 A2 | 11/2009 | |
| EP | 2196501 A1 | 12/2009 | |
| EP | 2149920 A1 | 2/2010 | |
| EP | 2336230 A1 | 6/2011 | |
| JP | 2001301230 | 10/2001 | |
| JP | 2006165029 | 6/2006 | |
| KR | 100809658 | 3/2008 | |
| WO | WO 2006059828 | 6/2006 | |
| WO | WO 2006060141 A2 | 6/2006 | |
| WO | WO 2011061650 A1 | 5/2011 | |
| WO | WO 2012016850 A1 | 2/2012 | |
| WO | WO 2012/091971 A1 | 7/2012 | |
| WO | WO 2012120434 | 9/2012 | |

OTHER PUBLICATIONS

First Office Action from Chinese Patent Appl. No. 201210031021.0, dated Dec. 30, 2013.
International Search Report for PCT Patent Application No. PCT/US2012/028327, dated Nov. 23, 2012.
International Preliminary Report on Patentability from PCT/US2012/028327, dated Oct. 3, 2013.
Office Action from U.S. Appl. No. 13/040,088, dated May 7, 2013.
Response to OA from U.S. Appl. No. 13/040,088, filed Jun. 20, 2013.
Office Action from U.S. Appl. No. 13/051,894, dated Jan. 14, 2013.
Response to OA from U.S. Appl. No. 13/051,894, filed May 6, 2013.
Cree® family of LED chips, DA, EZ, GaN, MB, RT, TR, UT, and XT, printout from cree.com, 2 pages.
Bergquist Co., Chanhassen, Minn., "T-Clad" overview product sheet, 3 pages.
Cree® XLampC family product info printout, from cree.com, 20 pages.
Cree® XLampXM product info printout, from cree.com, 13 pages.
Cree® XLampMC product info printout, from cree.com, 14 pges.
Citizen Micro HumanTech, "COB-High-wattage Series & Low-wattage Series". Short Form Lighting LED Catalog 2012, Citizen Electronics Co., Ltd. Japan. 7 pages.

(56) References Cited

OTHER PUBLICATIONS

U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.
U.S. Appl. No. 12/463,709, filed May 11, 2009, Donofrio.
U.S. Appl. No. 13/034,501, filed Feb. 24, 2011, Le, et al.
U.S. Appl. No. 13/028,946, filed Feb. 16, 2011, Le, et al.
U.S. Appl. No. 13/368,217, filed Feb. 7, 2012, Pickard, et al.
U.S. Appl. No. 12/873,303, filed Aug. 31, 2010, Edmond, et al.
Office Action from U.S. Appl. No. 13/770,389, dated Sep. 15, 2014.
International Search Report and Written Opinion from Appl. No. PCT/US2014/045888, dated Sep. 19, 2014.
Office Action from U.S. Appl. No. 13/051,894, dated Jun. 18, 2014.
Office Action from U.S. Appl. No. 13/649,052, dated Jul. 24, 2014.
Second Office Action from Chinese Patent Appl No. 201210031021.0, dated Jun. 4, 2014.
International Search Report and Written Opinion from PCT/US2013/062640, dated May 22, 2014.
Fourth Office Action from Chinese Patent Appl. No. 201210031021.0, dated Jul. 16, 2015.
Decision to Grant from German Patent Appl. No. 10 2007 040 811.2, dated Jul. 3, 2015.
Office Action from U.S. Appl. No. 13/902,080, dated Jun. 2, 2015.
Office Action from U.S. Appl. No. 13/770,389, dated Jul. 1, 2015.
Office Action from U.S. Appl. No. 13/957,290, dated Jul. 6, 2015.
Notification of the Third Office Action from Chinese Patent Appl. No. 201210031021.0, dated Jan. 28, 2015.
Correction of Deficiencies notice from European Patent Appl. No. 13730742.7-1551, dated Feb. 3, 2015.
Office Action from German Patent Appl. No. 10 2007 040 811.2, dated Feb. 12, 2015.
Office Action from U.S. Appl. No. 13/051,894, dated Dec. 12, 2014.
Notice of Acceptance for Invalidation from Chinese Appl. No. 200710148327.3, dated Jan. 27, 2015 and Chinese version.
International Preliminary Report and Written Opinion from Appl. No. PCT/US2013/044277, dated Dec. 24, 2014.
International Preliminary Report on Patentability from Appl. No. PCT/US2013/062640, dated Apr. 23, 2015.
Office Action from German Patent Appl No. 10 2007 040 811.2, dated Feb. 12, 2015.
Office Action from U.S. Appl. No. 13/770,389, dated Mar. 12, 2015.
Office Action from U.S. Appl. No. 14/183,218, dated Aug. 10, 2015.
Office Action from U.S. Appl. No. 13/051,894, dated Sep. 21, 2015.
Office Action from U.S. Appl. No. 13/902,080, dated Sep. 24, 2015.
Office Action from U.S. Appl. No. 13/770,389, dated Oct. 26, 2015.
Notice of Allowance letter from Chinese Patent Appl. No. ZL201210031021.0, dated Jan. 5, 2016.
Office Action from U.S. Appl. No. 13/957,290; dated Jan. 21, 2016.
Office Action from U.S. Appl. No. 13/770,389, dated Mar. 23, 2016.
Office Action from U.S. Appl. No. 14/183,218, dated Mar. 24, 2016.
Notification of Entry into European Phase for Appl. No. 14742722.3; dated Mar. 18, 2016.
Office Action for U.S. Appl. No. 14/575,805; dated Jul. 21, 2016.
Office Action for U.S. Appl. No. 13/902,080; dated Aug. 12, 2016.
Office Action for U.S. Appl. No. 13/770,389; dated Aug. 17, 2016.
Office Action for U.S. Appl. No. 14/183,218; dated Sep. 6, 2016.
Office Action for U.S. Appl. No. 13/957,290; dated Sep. 12, 2016.
Office Action for U.S. Appl. No. 13/051,894; dated Oct. 3, 2016.
Foreign Office Action for European Patent Appl. No. 13730742.7; dated Oct. 14, 2016.
Office Action for U.S. Appl. No. 14/633,734; dated Nov. 3, 2016.
Foreign Office Action for European Application No. 14742722.3; dated Nov. 3, 2016.
Foreign Office Action for Taiwan Application No. 04489/10521496400; dated Dec. 5, 2016.
Office Action for U.S. Appl. No. 13/957,290; dated Feb. 13, 2017.
Office Action for U.S. Appl. No. 14/575,805; dated Feb. 27, 2017.
Office Action for U.S. Appl. No. 13/770,389; dated Mar. 9, 2017.
Office Action for U.S. Appl. No. 13/051,894; dated Mar. 23, 2017.
Office Action for U.S. Appl. No. 14/183,218; dated Apr. 5, 2017.
Foreign Notice of Allowance for Taiwan Application No. 102120670; dated May 1, 2017.
Chinese Office Action for Application No. 201380030664.6; dated Jul. 17, 2017.
Chinese Office Action for Application No. 201380030664.6; dated Jul. 26, 2017.
Office Action for U.S. Appl. No. 14/575,805; dated Aug. 28, 2017.
Office Action for U.S. Appl. No. 14/183,218; dated Sep. 11, 2017.

* cited by examiner

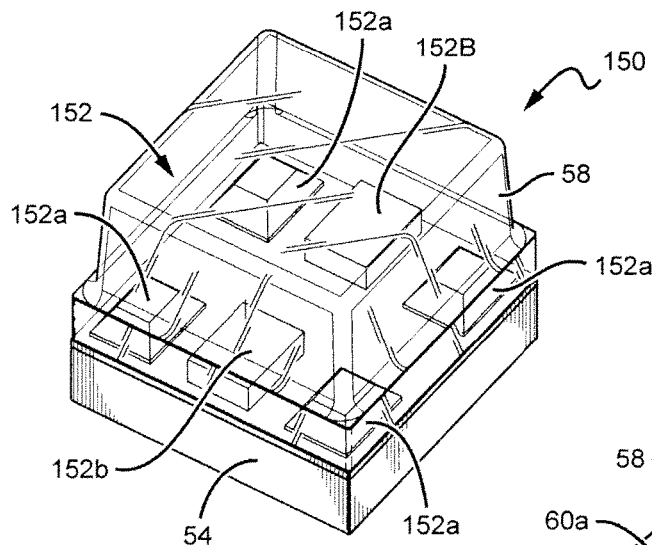
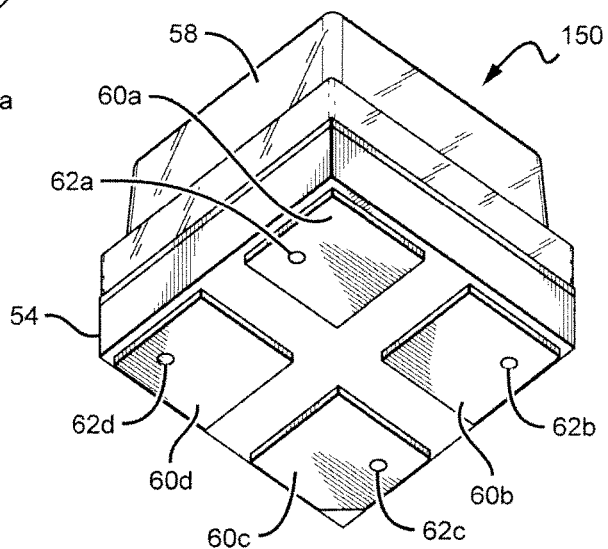
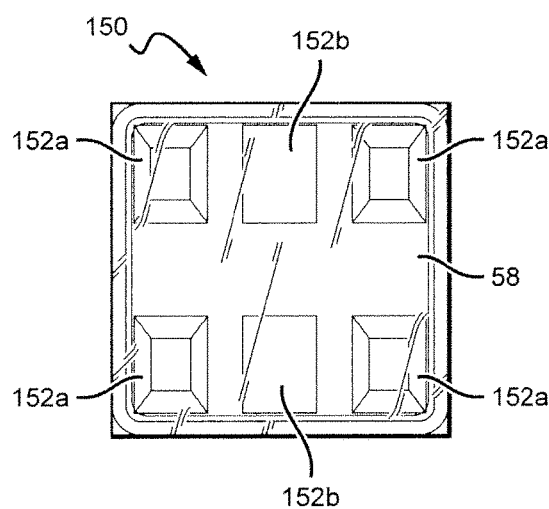
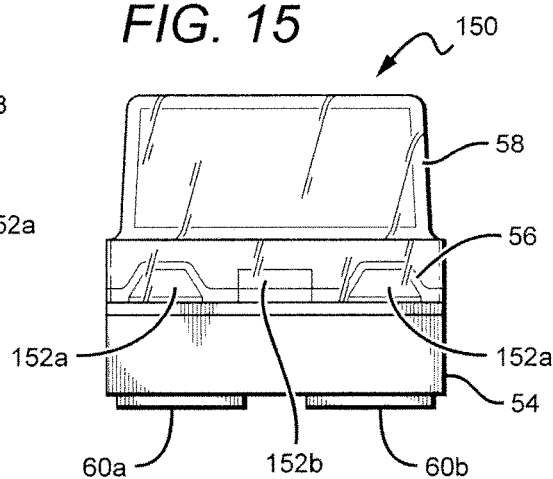

LED PACKAGE WITH MULTIPLE ELEMENT LIGHT SOURCE AND ENCAPSULANT HAVING PLANAR SURFACES

This application claims the benefit of U.S. Provisional Patent Application Ser. No. 61/658,271, filed on Jun. 11, 2012, U.S. Provisional Patent Application Ser. No. 61/660,231, filed on Jun. 15, 2012, and U.S. Provisional Patent Application Ser. No. 61/696,205, filed on Sep. 2, 2012.

BACKGROUND OF THE INVENTION

Field of the Invention

This invention pertains to solid state light emitters and in particular to light emitting diode (LED) packages with multiple LEDs, with the packages capable of producing high efficiency light emission with a wider emission pattern from a device with smaller footprint.

Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1a, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

Another conventional LED package 30 shown in FIG. 3 comprises an LED 32 on a submount 34 with a hemispheric lens 36 formed over it. The LED 32 can be coated by a conversion material that can convert all or most of the light from the LED. The hemispheric lens 36 is arranged to minimize total internal reflection of light. The lens is made relatively large compared to the LED 32 so that the LED 32 approximates a point light source under the lens. As a result, the amount of LED light that reaches the surface of the lens 36 is maximized to maximize the amount of light that emits from the lens 36 on the first pass. This can result in relatively large devices where the distance from the LED to the edge of the lens is maximized, and the edge of the submount can extend out beyond the edge of the encapsulant. Further, these devices generally produce a lambertian emission pattern that is not always ideal for wide emission area applications. In some conventional packages the emission profile can be approximately 120 degrees full width at half maximum (FWHM).

Lamps have also been developed utilizing solid state light sources, such as LEDs, in combination with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light to a different wavelength through a phosphor or other conversion material. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

SUMMARY OF THE INVENTION

The present invention is generally directed to LED packages that are compact and efficiently emit light, and can comprise encapsulants with planar surfaces that refract and/or reflect light within the package encapsulant. The packages can also comprise a submount with a plurality of LEDs and a blanket conversion material layer on one or more of the LEDs. The blanket conversion material may also cover at least part of the submount. The encapsulant can be on the submount, over the LEDs, and over at least part of the blanket conversion material. Some of the light reflected within the encapsulant, due, for example, to total internal reflection from planar or otherwise shaped encapsulant surface, will reach the conversion material, where it may be scattered or absorbed and converted and then emitted omnidirectionally. This allows for reflected light to now escape from the encapsulant. This allows for efficient emission and a broader emission profile, for example when compared to conventional packages with hemispheric encapsulants or lenses.

In certain embodiments, the LED package provides a higher chip area to LED package area ratio. By using an encapsulant with planar surfaces, the LED package can provide unique dimensional relationships between the various package features, enabling more flexibility in using the packages in different applications, for example linear LED lights for replacing linear fluorescent lights. Different LED packages according to the present invention can have different shapes, such as rectangular, and can have a greater width than height. The different embodiments can provide unique dimensional relationships which can include: encapsulant height, width and distance to the edge of the LED chip(s), distance between LED chips in a multiple chip embodiment, LED epitaxial area verses package area, broader emission pattern per package footprint, more light output power per package footprint, improved mixing or blending or uniformity of different colors emitted by the package.

One embodiment of an emitter package according to the present invention comprises a plurality of solid state light sources on a submount and conversion material layer covering at least some of the emitters and the top surface of the submount. An encapsulant can be included over the conversion material layer, with the encapsulant having one or more planar surfaces.

One embodiment of an LED package according to the present invention comprising multiple LEDs mounted on a submount. An encapsulant is included on the submount, with the encapsulant having one or more planar surfaces. A blanket conversion material layer is included over the submount and at least some of the LEDs, the conversion layer being between the submount and the encapsulant. The package emitting light intensity in range of 100 to 150 lumens per Watt.

Another embodiment of an LED package according to the present invention comprises a plurality of LEDs mounted on a submount, with at least two of the plurality of LEDs emitting different colors of light. The different emitting LEDs can be separately controllable to control their emission intensity. A conversion material layer can be included over at least some of the LEDs, and an encapsulant can be included on the submount, with the encapsulant having one or more planar surfaces.

One embodiment of a solid state luminaire according to the present invention comprises a solid state light source with a plurality of LED packages. The LED packages comprise a multiple LED light source on a submount, a blanket conversion material layer on the submount and at least some of the LEDs, and an encapsulant over the conversion material layer with the encapsulant having one or more planar surfaces.

These and other aspects and advantages of the invention will become apparent from the following detailed description and the accompanying drawings which illustrate by way of example the features of the invention.

BRIEF DESCRIPTION OF THE DRAWINGS

FIG. 12 is a top perspective view of another embodiment of an LED package according to the present invention;

FIG. 13 is a bottom perspective view the LED package shown in FIG. 12;

FIG. 14 is a top view of the LED package shown in FIG. 12;

FIG. 15 is another side elevation view of the LED package shown in FIG. 12;

DETAILED DESCRIPTION OF THE INVENTION

Figure 1:
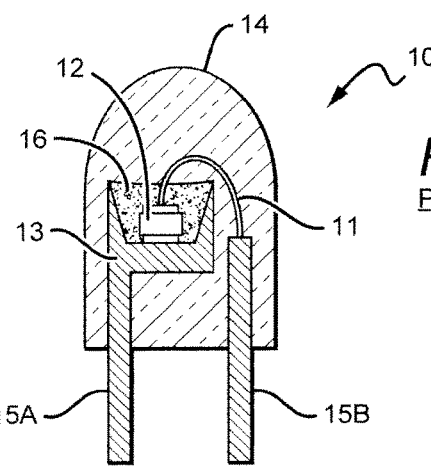
FIG. 1 shows a sectional view of one embodiment of a prior art LED package.
Figure 2:
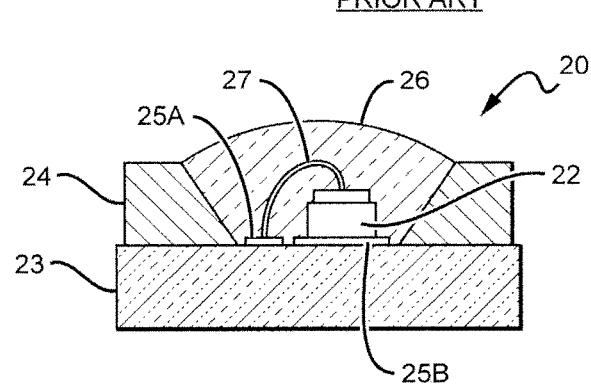
FIG. 2 shows a sectional view of another embodiment of a prior art LED package.
Figure 3:
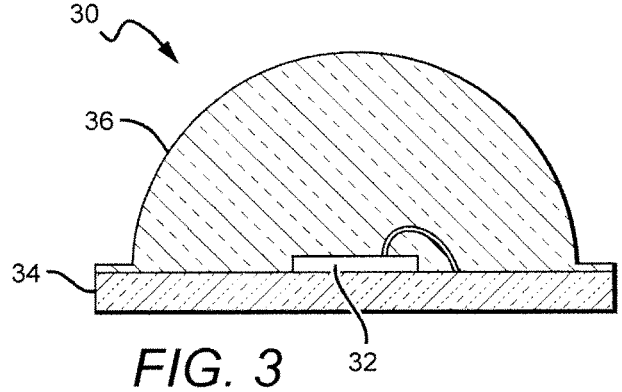
FIG. 3 shows a sectional view of still another embodiment of a prior art LED package.
Figure 4:
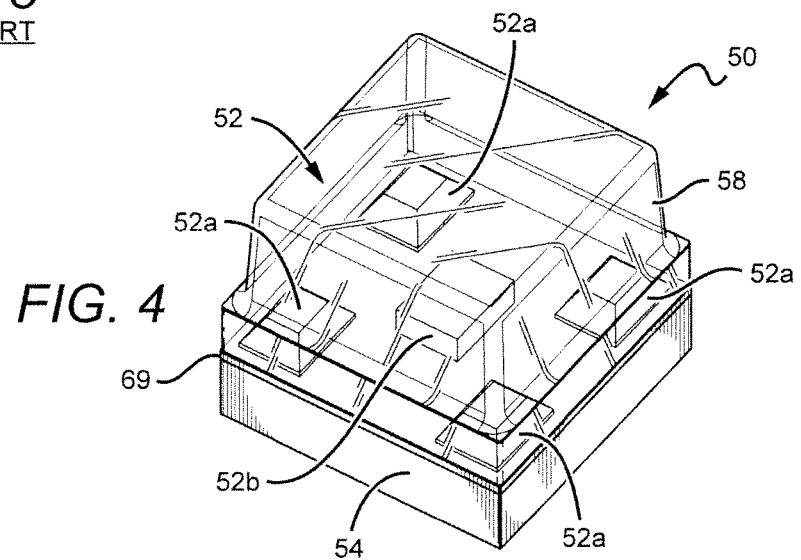
FIG. 4 is a top perspective view of one embodiment of an LED package according to the present invention.

The present invention is directed to different embodiments of LED package structures having a light source that comprises a plurality of LED chips. The LED packages can be arranged in different ways and are relatively small, while at the same time are efficient, reliable and cost effective. Some embodiments according to the present invention, can emit with same or similar efficiency to a similar LED packages with hemispheric encapsulants, but can be smaller and less expensive to manufacture.

The packages according to the present invention can provide these improvements by having conversion material and encapsulants that are arranged and shaped to capitalize on the total internal reflection (TIR) of light within the package. That is, the encapsulant can be shaped such that light incident on the package encapsulant at angles greater than the critical angle for TIR can be reflected back towards a conversion material within the package such that the light is converted or "recycled". This recycled light is scattered or converted and re-emitted from the conversion material omnidirectionally, such that some of the converted light will be redirected and will reach the surface of the encapsulant at an angle less than the critical angle and emit from the package. By arranging the LED packages to provide this photon recycling of reflected light, such as TIR light, the LED packages can be provided with different encapsulant shapes and sizes that are closer to that of the package light source, and the edge of the light source can be closer to the edge of the encapsulant. In some embodiments, the LED packages can have planar surfaces that result in a certain amount of TIR light within the encapsulant. Using planar surfaces can provide increased flexibility in the different shapes that can be used beyond conventional hemispheric lenses, that are typically arranged to minimize TIR light, and the use of planar surfaces can allow for more compact LED packages.

Some package embodiments according to the present invention can comprise LED packages with encapsulants having multiple planar surfaces, with at least some of the planar surfaces arranged to enhance TIR. Light from the package's LED light source can be less likely to reach the planar surface at angles less than the critical angle and can experience TIR. The planar surfaces can be relatively smooth such that light reaching the surfaces outside the critical angle experience TIR, without being redirected or scattered by features such as texturing or shaping. The LED light source as well as the surrounding substrate and conductive traces can be covered by a blanket layer of conversion material. TIR light can be reflected back toward the LED and substrate, and in conventional packages where the substrate comprises an absorbing surface the light can be absorbed. By blanketing the LED and the surrounding surfaces with a converting material, the TIR light can be scattered or converted and recycled to emit from the LED package before it reaches the absorbing surfaces, thereby improving package efficiency.

The LED packages according to the present invention can comprise a plurality of LEDs or LED chips on a submount, with contacts, attach pads and/or traces for applying an electrical signal to the one or more LEDs. The plurality of LEDs can emit the same color of light or can emit different colors of light such that the LED package emits the desired color combination of the light from the LED chips. The LED packages can be arranged with LEDs chips in different patterns, and in some embodiments the LED chips can be of the same type that emits the same color of each type could be used, and in other embodiments additional LEDs can be used that produce additional colors of light. In some embodiments, all or some of the LED chips can be covered by the conversion material, with others of the LED chips uncovered. By using one or more LEDs emitting one or more additional colors and/or having some covered by a wavelength conversion material, the color rendering index (CRI) of the lighting unit can be increased. As described below the conversion material layer can comprise one or more conversion materials, such as phosphors, to provide the desired LED package emission, such as the white light with the desired temperature and CRI. A further detailed example of using LEDs emitting light of different wavelengths to produce substantially white light can be found in issued U.S. Pat. No. 7,213,940, which is incorporated herein by reference.

Some LED packages according to the present invention can comprise a first group of LED chips coated by the conversion material layer comprising at least one conversion material. The packages also include one or more of a second type of LED chip emitting at a different wavelength of light, with the second LED chips not covered by the conversion material. Each of the first group of LED chips, if illuminated, can emit a blue light having a dominant wavelength in the range of from 430 nm to 480 nm. The conversion material layer can be excited by the blue light, and can absorb at least some of the blue light and can reemit light having a dominant wavelength in the range of from about 555 nm to about 585 nm. This light can be referred to as blue shifted yellow (BSY) light. The second LED chip type can be uncovered by the conversion material layer and if energized with current, can emit red or orange light having a dominant wavelength in the range of from 600 nm to 650 nm.

With both the first and second LED chips emitting light, the LED packages can emit a combination of (1) blue light exiting the package from the first group of LED chips, (2) BSY light exiting the package comprising light from the first LED chips absorbed by the conversion material layer and then reemitted and (3) light exiting the lighting device from the second group of LED chips in the red or orange wavelength regime. In an absence of any additional light, this can produce a LED package emission mixture of light having x, y coordinates on a 1931 CIE Chromaticity Diagram different from the primary emitter wavelengths and within the polygon created by the x, y color coordinates of the emissions of the first, second LED chips and the individual conversion material constituents. The combined light emission coordinates may define a point that is within ten MacAdam ellipses of at least one point on the blackbody locus on a 1931 CIE Chromaticity Diagram. In some embodiments, this combination of light also produces a sub-mixture of light having x, y color coordinates which define a point which is within an area on a 1931 CIE Chromaticity Diagram enclosed by first, second, third, fourth and fifth connected line segments defined by first, second, third, fourth and fifth points. The first point can have x, y coordinates of 0.32, 0.40, the second point can have x, y coordinates of 0.36, 0.48, the third point can have x, y coordinates of 0.43, 0.45, the fourth point can have x, y coordinates of 0.42, 0.42, and the fifth point can have x, y coordinates of 0.36, 0.38.

As described in more detail below, the encapsulant can comprise many different shapes with planar surfaces, and in some embodiments, the encapsulant can be cube shaped and can be included over the LEDs chips and the submount. The conversion material layer can be included between the encapsulant and the LEDs array and submount. The LED packages according to the present invention can comprise a thinner phosphor layer or lower phosphor concentration than in conventional LED packages at the same color point, such that more blue light passes through the conversion material layer on the first pass. Since typical conversion layers also scatter as well as convert blue light, this can lead to improved package efficiency since the reduced thickness or concentration of the conversion layer results in less scattering of the first-pass blue light emitted by the LED back into the LED, where it may be absorbed. By achieving a similar color compared to conventional LED packages but with a thinner or lower concentration conversion layer, cost savings may also be realized in the manufacture of the LED packages fabricated according to the present invention. A portion of blue and yellow light from the conversion material reaches the surface of the encapsulant within the critical angle and emits from LED package. Compared to conventional LED packages with hemispheric type encapsulants, a greater percentage of blue and yellow light will experience TIR such that light reflects within the encapsulant. This results in the blue and yellow light eventually reaching the conversion material following TIR; i.e. the light is recycled by TIR. Blue TIR light illuminates the top of the conversion layer, while blue light from the LED illuminates the bottom surface of the conversion layer, such that both sides of the conversion layer are illuminated. The "blanket" effect provided by the conversion material layer limits both blue and yellow light from re-entering the chip or hitting other absorbing regions on the submount. This reduces the amount of light that might be absorbed as the light experiences TIR within the package.

The conversion of blue light at the conversion layer results in omnidirectional re-emission of yellow light from the conversion material layer. Illumination of both sides of the conversion material layer results in conversions of TIR blue light into omnidirectional yellow light. This provides the advantage of allowing for greater opportunities for otherwise TIR light to escape from the package. This recycling can also scatter light, which can result in LED package emissions patterns that are wider than conventional devices that provide a predominantly Lambertian emission pattern. This scattering can also result in reduced variations in color temperature at different viewing angles.

It is understood that in other embodiments, the conversion material layer can coat only one or more of the LEDs, leaving the submount uncovered by the conversion material layer. For multiple LEDs embodiments, different conversion material layers can included on different ones of the LEDs. It also understood that in other embodiments having different conversion material layer embodiments, the different conversion materials can also coat some or all of the submount, which can result in different conversion materials covering the all or some of the submount, or different conversion materials in different areas of the submount. Accordingly, it is understood that in different embodiments, the conversion material can be on the LEDs, on the submount and/or in the encapsulant. These different embodiments can have different combinations of the conversion material locations. Other embodiments can have multiple phosphors on the LEDs, submount and or in the encapsulant. Some of these embodiments can comprise a three phosphor mixture such as yellow (e.g. YAG), green (e.g. LuAg) and reg (e.g. nitride). This is only one example of the many phosphor mixtures that can be used in different embodiments. In still other embodiments, the emitters and submount can be provided without a conversion material layer, or a conversion material can be included only on the submount. In these embodiments, the packages can comprise LEDs emitting different colors of light that combine to produce the desired LED package emission. This can include, for example, red, green and blue emitting LEDs whose emission can be combined to produce white light. Like other embodiments discussed herein, these different LEDs can be individually addressable.

Other mechanisms which re-direct light within the encapsulant, such as scattering or refraction, may be used in combination with or in place of TIR. For example, in one embodiment, a scattering material may be added to the encapsulant to further enhance color uniformity in the light emitted by the package, or to produce a broader beam intensity profile while maintaining high package efficiency. The LED packages according to the present invention can be used with many different luminaires, with the LED packages resulting in improved color mixing. This can result luminaires producing the desired emission without the need for mixing chambers, or with the use of reduced height mixing chambers.

The different embodiments can also comprise LED packages with relatively small footprints, with some having a footprint smaller than 3 mm square, while other embodiments can have a footprint smaller than 2 mm square. These embodiments can also provide devices having a footprint that is closer in size to the area covered by the LED. The embodiments can also exhibit height and footprint dimensions that are relatively close to one another as further described below.

For those embodiments with multiple LED light sources, individual ones of the LEDs can be individually addressable or controlled, or different strings or subsets of the multiple LEDs can be individually addressable or controlled. A string can be one LED or multiple LEDs coupled together in different parallel and/or serial connections to achieve the desired operating voltages or to achieve the desired package emission color temperature. This can be applicable to many different package arrangement such as those having LEDs emitting different colors or LEDs with phosphor coating that are from different bins.

The present invention is described herein with reference to certain embodiments, but it is understood that the invention can be embodied in many different forms and should not be construed as limited to the embodiments set forth herein. In particular, the present invention is described below in regards to certain LED packages having LEDs in different configurations, but it is understood that the present invention can be used for many other LED packages with other LED configurations. The LED packages can also have many different shapes beyond those described below, such as rectangular, and the solder pads and attach pads can be arranged in many different ways. In other embodiments, the emission intensity of the different types of LED chips can be controlled to vary the overall LED package emission.

The present invention can be described herein with reference to conversion materials, wavelength conversion materials, remote phosphors, phosphors, phosphor layers and related terms. The use of these terms should not be construed as limiting. It is understood that the use of the term remote phosphors, phosphor or phosphor layers is meant to encompass and be equally applicable to all wavelength conversion materials.

The embodiments below are described with reference to an LED or LEDs, but it is understood that this is meant to encompass LED chips, and these terms can be used interchangeably. These components can have different shapes and sizes beyond those shown and different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 4 through 8 show one embodiment of an LED package 50 according to the present invention comprising LEDs 52, mounted on a submount 54. The LED package 50, also comprises first, second, third and fourth contact/solder pads 60a-c on the bottom of the submount 54, first, second, third and fourth conductive vias 62a-c passing through the submount 54. The vias are arranged to conduct an electrical signal to die attach pads (not shown herein but described in more detail below) on the top surface of the submount 54. The LED package further comprises a conversion material layer 56 covering at least some of the LEDs 52, the exposed surfaces of the die attach pads, and exposed portions of the top surface of the submount 54. An encapsulant 58 is included over the submount 54 with the LEDs 52 and the die attach pads between the submount 54 and the encapsulant 58. The above features of the LED package are described in detail below.

The LEDs 52 can comprise different LEDs emitting at different wavelengths of light, and in the embodiment shown the LEDs 52 can comprise four blue emitting LEDs 52a and red emitting LED 52b. It is understood that different numbers of the LEDs can be used and in other embodiments different types of LEDs can be used. Many different LEDs can be used such as those commercially available from Cree Inc., under its DA, EZ, GaN, MB, RT, TR, UT and XT families of LED chips. LED substrate materials may be silicon carbide (SiC), sapphire, gallium nitride (GaN) or others. The LED package 50 is particularly arranged for use of blue emitting LEDs from the DA family of chips that can be flip chip mounted to the submount with wire-free bonding. These types of chips are generally described in U.S. patent application Ser. No. 12/463,709 to Donofrio et al., entitled "Semiconductor Light Emitting Diodes Having Reflective Structures and Methods of Fabricating Same," which is incorporated herein by reference. Commercially available red LEDs can be used with these blue emitting LEDs. It is understood that in some embodiments the LEDs 52a, 52b can be provided following removal of its growth substrate. In other embodiments, the LED's growth substrate can remain on the LEDs 52a, 52b with some of these embodiments having a shaped or textured growth substrate.

In other embodiments, more than one LED can be used as the light source, while in other embodiments solid state lasers can used either alone or in combination with one or more LEDs. In some embodiments, the LEDs can comprise a transparent growth substrate such as silicon carbide, sapphire, GaN, GaP, etc. The LED chips can also comprise a three dimensional structure or geometry, and in some embodiments the LEDs can have structure comprising entirely or partially oblique facets on one or more surfaces of the chip.

The LEDs 52a, 52b are mounted to die attach pads on the submount 54. The submount 54 can be formed of many different materials with a preferred material being electrically insulating, such as a dielectric material. The submount 54 can comprise a ceramic material such as alumina, aluminum nitride, silicon carbide, or a polymeric material such as polymide and polyester. In the preferred embodiment, the submount 54 can comprise a dielectric material having a relatively high thermal conductivity, such as aluminum nitride and alumina. In other embodiments the submount 54 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

The top surface of the submount 54 has a top planar surface with the die attach pads comprising patterned conductive features that can also include conductive traces. The die attach pads can be arranged in many conventional ways, with the LEDs mounted to the attach pads such that each spans a space between adjacent ones of the attach pads. Different die attach pad patterns or arrangements can be used and in some embodiments the same electrical signal to be applied to all the LED chips. In other embodiments the attach pads can be arranged to allow for different signals to be applied to different ones of the LED chips. Many different mounting methods can be used for mounting the LED chips 52a, 52b to the die attach pads, such as methods utilizing conventional solder materials. The LED chips can also be be electrically connected to the attach pads or other conductive traces using known surface mount or wire bonding methods, depending on the geometry of the LED chips 52.

The solder pads 60a-c, conductive vias 62a-c, and attach pads can comprise many different materials, such as metals or other conductive materials, and in one embodiment they can comprise copper deposited using known techniques such as plating. In other embodiments these features can be sputtered using a mask to form the desired pattern, and in other embodiments they can be formed using known photolithography processes. A space or gap is provided between the solder pads 60a-c to minimize the chance of electrical shorting between the pads. In the embodiment shown, the space between the pads can be in the range of 400 to 600 μm, with the embodiment shown having a space of gap in the of approximately 500 μm. In other embodiments, the solder pads can be thinner, which can allow for a smaller space between the pads 60a-c. In other embodiments, the space can be less than 400 μm, while in other embodiments it can be less than 300 μm. In still other embodiments is can be less than 200 μm, with some having solder pads thin enough to provide for a spacing of approximately 50 μm.

In the embodiment shown, the solder pads 60a-c are substantially square shaped and are arranged in the corners of the submount 54. It is understood, however, that in other embodiments the solder pads can have different shapes and can be arranged in different locations. For example, in some embodiments the solder pads can have a rectangular shape and can be arranged in different locations around the edge of the submount to maximize the spacing between the electrodes. In other embodiments, the solder pads can be triangular shaped and can be located in the corners of the submount to again maximize the space between the electrodes. The solder pads can also have different shapes on the same submount, with some combining different shapes to most effectively space the solder pads. In these different embodiments, vias can still be provided to conduct an electrical signal to the die attach pads.

In some embodiments, the attach pads can extend beyond the edge of the LEDs 52 to cover most of the top surface of the submount 54. This can help in thermal management for the LED package 50 by spreading heat from the LEDs 52 into the pads so that heat spreads beyond the edge of the LEDs 52 into more area of the submount 54. This allows the heat to be less localized and allows it to more efficiently dissipate through the surmount 54 into the ambient.

The conversion material layer 56 is included over the blue emitting LEDs 52a, exposed portions of the attach pads (described below), and exposed portions of the submount's top surface. In the embodiment shown, the red emitting LED 52b may not be covered by the conversion material layer, but it is understood that in other embodiments it could be covered by one or more conversion materials. The uncovered red LED chips may present a surface that can absorb light instead of recycling light, but in the embodiments shown this absorbing surface can be relatively small compared to the overall area of the submount's top surface such that this presents and acceptable amount of light absorption.

Many different conversion materials can be used in the conversion material layer 56 to generate the desired LED package light emission, with the present invention being particularly adapted to LED packages emitting white light. In some white emitting embodiments, the LED 52 can emit light in the blue wavelength spectrum. In other embodiment the LED can emit light in the violet to UV part of the spectrum for example in the wavelength range between 360 nm and 440 nm. The conversion material can be of the type that absorbs blue light or other wavelength light and re-emits for instance yellow light such that the package emits a white light combination of blue and yellow light. In some embodiments, the conversion material can comprise a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used include but is not limited to: $Tb_{3-x}RE_xO_{12}$:Ce (TAG); RE=Y, Gd, La, Lu; or $Sr_{2-x-y}Ba_xCa_ySiO_4$:Eu.

In other embodiments, the conversion material layer 56 can be arranged with more than one phosphor material either mixed or in separate layers. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:

$Sr_xCa_{1-x}S$:Eu, Y; Y=halide;
$CaSiAlN_3$:Eu; or
$Sr_{2-y}Ca_ySiO_4$:Eu

Other phosphors can be used to create color emission by converting substantially all light to a particular color. For example, the following phosphors can be used to generate green light:
$SrGa_2S_4$: Eu;
$Sr_{2-y}Ba_ySiO_4$:Eu; or $SrSi_2O_2N_2$:Eu.

The following lists some additional suitable phosphors used as conversion particles, although others can be used. Each exhibits excitation in the blue and/or UV emission spectrum, provides a desirable peak emission, has efficient light conversion, and has acceptable Stokes shift:

Blue
$BaMgAl_{10}O_{17}$:Eu
$(Sr,Ba)_3MgSi_2O_8$:Eu
$(Ca,Sr)_5(PO4)_3Cl$:Eu

Yellow/Green
$(Sr,Ca,Ba)(Al,Ga)_2S_4$:$Eu^{2+}$
$Ba_2(Mg,Zn) Si_2O_7$:$Eu^{2+}$
$Gd_{0.46}Sr_{0.31}Al_{1.23}O_xF_{1.38}$:$Eu^{2+}_{0.06}$
$(Ba_{1-x-y}Sr_xCa_y)SiO_4$:Eu
$Ba_2SiO_4$:$Eu^{2+}$ Red
$Lu_2O_3$:$Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:$Pr^{3+}$,$Ga^{3+}$
$CaAlSiN_3$:$Eu^{2+}$
$Sr_2Si_5N_8$:$Eu^{2+}$ In still other certain embodiments and dependent on the emission wavelength of the solid state light source, the conversion material layer can comprise at least three phosphors covering parts or all of the visible wavelength range, with some embodiments comprising a combination of yellow, red and green phosphors. For violet and UV emitting solid state light sources a blue phosphor may be added. Other combinations are possible, and other embodiments can comprise more than three phosphors. Many different yellow, red and green phosphors can be used, such as those described above.

The conversion material can comprise different sized phosphor particles including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be fixed on the remote phosphor in a binder, and the phosphor can also have different concentrations or loading of phosphor materials in the binder. A typical concentration of phosphor in a binder is typically a range of 30-70% by weight. In one embodiment, the phosphor concentration is approximately 65% by weight, and is preferably uniformly dispersed throughout the remote phosphor. The conversion material layer 56 can also have different regions with different concentrations of phosphor particles.

Alternate wavelength conversion materials may also be used to down-convert light to generate white emissions. Such materials may be, but are not limited to organic fluorescent materials or dyes or inorganic quantum dot materials such as CdSe/ZnS, InP/InAs, CdS/CdSe, CdTe/CdSe or others.

The conversion material layer 56 can have many different thicknesses depending at least partially on the concentration of the conversion material, the size of the conversion material particles, and the desired amount of light to be converted by the conversion material. Conversion material layer according to the present invention can be in a binder with phosphor concentration levels (phosphor loading) above 30%. Other embodiments can have concentration levels above 50%, while in still others the concentration level can be above 60%. In some embodiments the phosphor binder combination can have thicknesses in the range of 10-100 microns, while in other embodiments it can have thicknesses in the range of 40-50 microns. Thickness may also vary across the layer, with different regions having different thicknesses. As described in more detail below, the different packages according to the present invention can comprise conversion layers with less phosphor material (e.g. thinner or lower concentration) compared to similar packages with hemispheric encapsulants, while still maintaining the desired emission color point. This reduction in thickness depends on many different factors, such as the phosphor type, size of phosphor particles, and concentration of phosphor particles in the layer. In some embodiments, the reduction can be 10% or more compared to a similar LED package with hemispheric lens. In still other embodiments it can be 20% or more, while in other embodiments it can be 30% or more.

The conversion material layer 56 can also comprise a binder, and different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing. It is understood, however, that the phosphor particles can be applied without a binder.

The conversion material layer can be applied using different processes including but not limited to spraying, dispensing, spin coating, sputtering, printing, powder coating, electrophoretic deposition (EPD), and electrostatic deposition, among others. These processes can also include a solvent in the phosphor-binder mixture that can liquefy and lower the viscosity of the mixture. Many different solvents can be used including but not limited to toluene, benzene, zylene, or OS-20 commercially available from Dow Corning®, and different concentration of the solvent can be used. When the solvent-phosphor-binder mixture is sprayed, poured or dispersed heat from the remote phosphor evaporates the solvent and can also cure the binder in the mixture leaving a fixed phosphor layer. Various deposition methods and systems are described in U.S. Patent Application Publication No. 2010/0155763, to Donofrio et al., entitled "Systems and Methods for Application of Optical Materials to Optical Elements," and also assigned to Cree, Inc.

Referring to FIGS. 4 through 8, encapsulant 58 is included on the conversion material layer 56, and over the LEDs 52 and submount 54, with the encapsulant 58 providing environmental and mechanical protection, as well as allowing for the recycling of light as described above and described in more detail below. Unlike most conventional encapsulants, the encapsulant 58 has planar surfaces, and in the embodiment shown the encapsulant 58 has a generally cubic shape. The encapsulant can include both vertical and horizontal planar surfaces in the shape of a cube, but it is understood that encapsulant can take many different shapes, with some having one or more side surfaces that are not vertical and some having a top surface that are not horizontal. Other embodiments can have any shape with a flat top and vertical sidewalls with planar surfaces. These can include but are not limited to different prismatic or polygon shapes such as triangle, pentagon, hexagon, octagon, etc. These shapes comprise vertical surfaces numbering in the range of 3 to 12 or more. In still other embodiments, the encapsulant can be cylindrical with different cross sections such as circular or oval.

It is understood that encapsulant 58 and the LEDs 52 can be aligned in many different ways, with the embodiment shown having its red LED 52b as shown approximately aligned with the center or longitudinal axis of the encapsulant 58. The blue (or BSY) LED chips 52a can be at the corners of the submount 54 and the encapsuant 58. It is understood that this is only one of the many different patterns for the LED chips, with some having random placement of different emitting LED chips and others can have organized pattern of different emitting LED chips.

Many different materials can be used for the encapsulant 58 such as silicones, plastics, epoxies or glass, with a suitable material being compatible with molding processes. In some embodiments, the encapsulant can be optically transparent. Silicone is suitable for molding and provides suitable optical transmission properties. It can also withstand subsequent reflow processes and does not significantly degrade over time. The encapsulant can also be formed using many different methods, and in some embodiments a molding process (described in more detail below) can be used that simultaneously forms encapsulants 58 over a multitude of LEDs 52 on a submount panel.

In different embodiments, the encapsulant can have many different thicknesses, with some providing just enough encapsulant material to cover the LED and phosphor layer. In these embodiments, the layer can be as thin as 10 μm or more. In still other embodiments, the encapsulant can be as high as three times the submounts edge dimension. These are only some examples of encapsulant height, with other embodiments being thinner or higher. In some embodiments, the top surface of the encapsulant can have a slightly smaller area than the bottom of the encapsulant and/or the footprint of the LED package. In still other embodiments, the upper portions of the encapsulant can have a larger area than lower portions, or a larger area than the LED package footprint.

The solder pads 60a-d are formed on the bottom surface of the submount 54, and can be used for mounting the LED package 52 in place using known mounting methods, and for applying one or more electrical signals to the LED package. The embodiment shown comprises four contact pads 60a-d, that allow for different electrical signals to be applied to the LED package 50 to control the emission intensity of different ones of the blue and red LED chips 52a, 52b. In some embodiments, two of the solder pads can be used to apply an electrical signal to the blue emitting LEDs 52a, and the other two can be used to apply an electrical signal to the red emitting LED 52b. This allows for respective control of the emission intensity for the blue and red emitting LEDs 52a, 52b. It is understood that in other embodiments (as described below), LED packages according to the present invention can have two solder pads so that all the LED chips are responsive to the same electrical signal, or can have more than two four solder pads to allow for more control over the emission of respective ones of the LEDs 52a, 52b.

The solder pads 60 can be made of the same materials and can be formed in the same way as die attach pads. Conductive vias 62a-d can pass through the submount 54 with the vias being formed of a conductive material such as those used for the die attach pads and solder pads 60a-d. The vias are arranged to provide an electrically conductive path between the solder pads 60a-d and the die attach pads. The embodiment shown comprises four vias, with each providing a conductive path between a respective one of the solder pads 60a-d, and a respective one of the attach pads. This allows for an electrical signal applied to the solder pads 60a-d to be conducted through the submount 54 along the vias 62a-d, to the die attach pads. The signal is then conducted to the desired one of the LEDs 52a, 52b, causing it to emit light. It is understood that in other embodiments the electrical signal can be transmitted to the LED in other ways such as through conductive traces or wire bond pads arranged in different locations in the LED package, and running between the mounting surface or the submount, and the LED.

As mentioned above, the LED packages according to the present invention are relatively small, and as LED packages become smaller less space is available for including indicators showing polarity of an LED package. These indicators can be important when manufacturing the end product utilizing the LED packages. Conventional polarity indicators can comprise marks on the top surface of the LED package or where one solder pad can be larger than the other. With smaller LED packages there can be less room for marking on the top surface, and it can also be undesirable to make a solder pad smaller than the other because of resulting increases in the risk of soldering defects.

Figure 5:
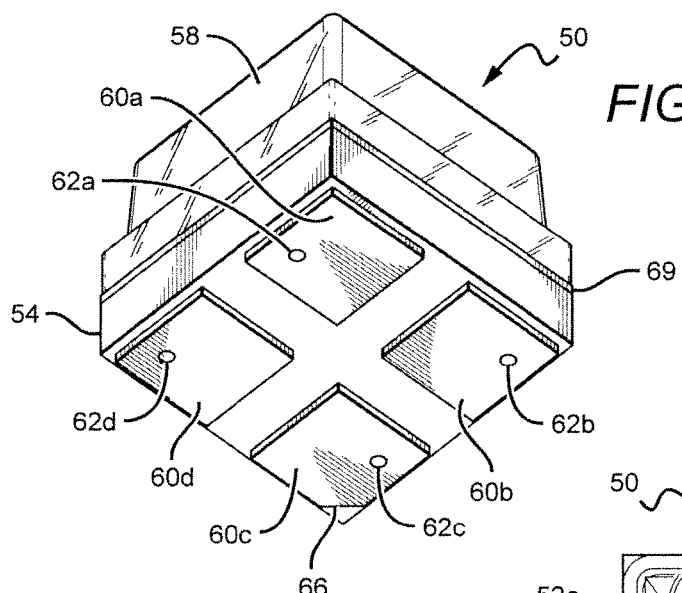
FIG. 5 is a bottom perspective view of the LED package shown in FIG. 4.
Figure 6:
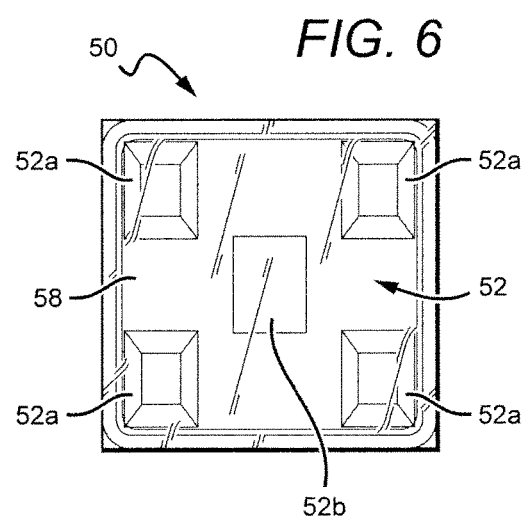
FIG. 6 is a top view of the LED package shown in FIG. 4.
Figure 7:
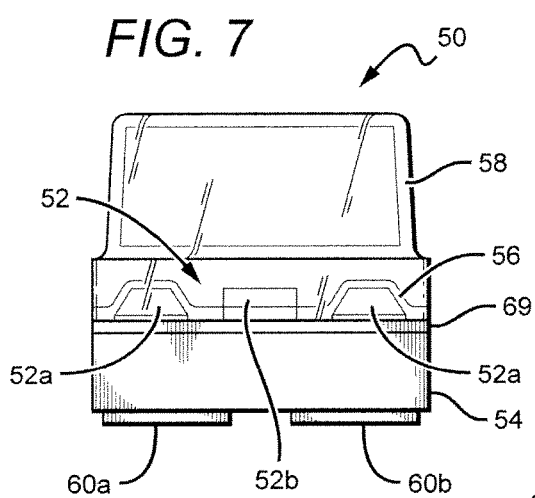
FIG. 7 is another side elevation view of the LED package shown in FIG. 4.
Figure 8:
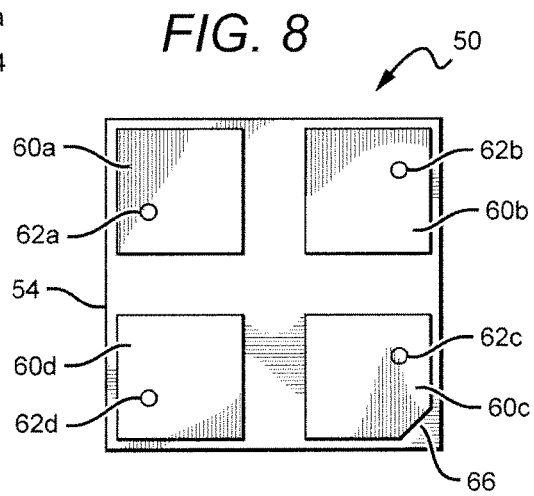
FIG. 8 is a bottom view of the LED package shown in FIG. 4.
Figure 31:
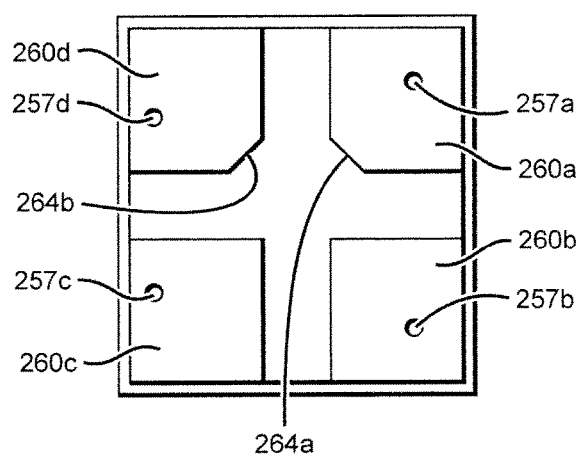
FIG. 31 is a top view of the solder pads in the LED package shown in FIG. 29.

The LED packages according to the present invention provide improved structures and methods of providing polarity indication by forming one or more indication notches 66 in one of the solder pads. As best shown in FIGS. 5 and 8, a notch 66 can be formed in the corner of the solder pad 60c. This notch 66 can be detected with up-looking cameras in automated pick-and-place equipment during manufacturing. As further described below, the polarity indicators can be in many different locations and can be arranged in many different ways as shown in FIG. 31. In other embodiments the notch 66 can be near the center of the submount 54. The notch 66 can have many different shapes beyond V-shaped, such as U-shaped, I-shaped, W-shaped, square shaped, rectangular shaped, star shaped, plus shaped, minus shaped, etc. It is noted that other types of polarity indicators can be used, such as holes of different shapes or other cutouts in the solder pads, and in other embodiments the LED packages can have indicators in other locations, such as on the submount 54.

Some embodiments according to the present invention can also comprise polarity indicators on the top surfaces of the LED package 50. In some embodiments, the attach pads can have a polarity indicator that can be one of the shapes mentioned above, such as a plus indicator to show polarity when viewing the LED package 50 from the top. As also mentioned above, for LED packages of the size shown in the attached figures and described herein, there may be limited space for top polarity indicators, and manufacturing devices may need to rely on the bottom polarity indicators.

As mentioned above, conventional knowledge in art was that TIR of LED light resulting from the planar surfaces of the encapsulant would result in significant reduction in LED package emission efficiency. This was thought to be particularly true for LED packages with vertical planar surfaces. It was thought that the TIR light would encounter light absorbing features of the LED package and would result in significant percentage of light being absorbed. This conventional knowledge focused LED packages providing encapsulants that minimize TIR, such as hemispheric encapsulants. The focus was also on providing package light sources near the center of the base of the encapsulant to simulate a point source near the center. However, it is believed that by providing a blanket conversion material layer over the top surfaces under the encapsulant 58, including the blue LED 52*a*, areas of the die attach pads around the LED 52, and the top surface of the submount 54 exposed around the LED 52, this expected efficiency loss can be minimized or eliminated.

Figure 9:
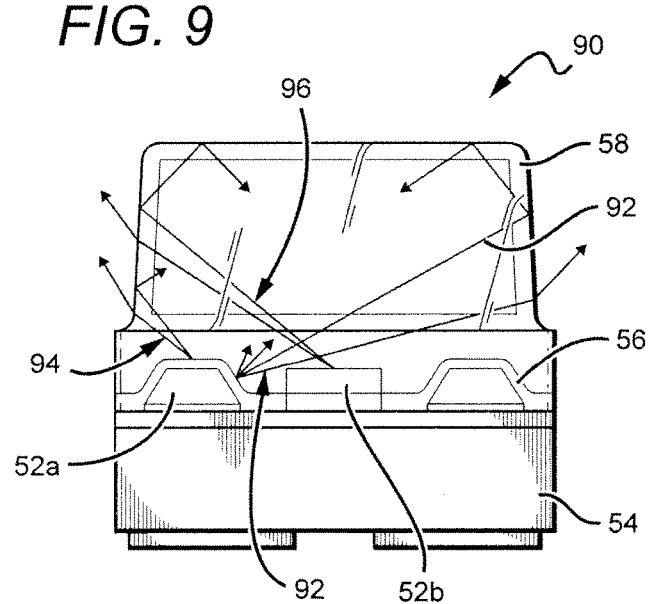
FIG. 9 is a side view of the LED package shown in FIG. 4.

Referring now to FIG. 9, an exemplary LED package according to the invention is shown with sample blue, yellow and red light traces 92, 94, 96. The LED package 90 comprises many of the same or similar features to those in LED package 50, and for those features the same reference numbers will be used herein. The LED package 90 comprises and blue emitting LEDs 52*a*, red emitting LEDS 52*b*, submount 54, conversion material layer 56, and an encapsulant 58. The LED package 90 can be arranged to emit different colors of light, and in the embodiment shown the LED chips 52*a*, 52*b* emits blue and red light, and the conversion material layer 56 comprises a conversion material that converts some of the blue light to yellow light. This results in blue, yellow and red light passing through the encapsulant and reaching its surface. Referring to the blue light trace 92, a portion of the blue light passes through the conversion material layer 56 and experiences TIR when it reaches the surface of the encapsulant 58. Other portions of the blue light 92 pass out of the encapsulant to contribute to emission from the LED package.

The blue TIR light reflects within the encapsulant and is eventually directed back toward the submount 54. Instead of reaching a light absorbing portion of the LED package, the TIR reaches the conversion material layer 56. This blue light has already passed through the conversion layer 56, and following TIR the blue LED light encounters the conversion material layer a second time. This can be referred to as "recycling" of the blue light that results in illumination of the top surface of the conversion material layer 56 such that both sides of the layer are illuminated by blue light during operation. The conversion material layer 56 provides a "blanket" effect that helps limit both blue and yellow light from re-entering the chip or hitting absorbing regions. When the blue light 92 hits the conversion material layer 56 a second time, all or a portion of the light will be scattered or absorbed by the conversion material in the layer and re-emitted as yellow light. The re-emission will be omnidirectional or isotropic such that a portion of the TIR light will be redirected so that it emits from the LED package. This omnidirectional reemission amounts to scattering of otherwise TIR light to allow for the light to reach the encapsulant surface within the critical angle and emit from the encapsulant.

When the blue light passes through the conversion material layer the first time, a portion of the blue light is converted to yellow light as shown in light trace 94. Red light also emits directly from the red LED as shown in light trace 96. A portion of yellow and red light will emit from the package on its first pass, while the remainder will experience TIR. This light can also experience scattering when it encounters the conversion material layer a second time, increasing the likelihood that some of the light will emit from the encapsulant and contribute to overall emission. In the embodiment shown, the LED package emits the desired white light combination of blue, yellow and red light.

The result is that the TIR and recycling allows for emission efficiencies of the LED packages according to the present invention to be similar to conventional hemispheric lensed LEDs. Embodiments of the present invention have reduced concentrations of conversion material in the conversion material layer to achieve the same color point due to the recycling effect. This can allow for more blue light to pass through the phosphor on the first pass. Since typical conversion layers can scatter as well as convert blue light, a reduced thickness or concentration of conversion material on the chip can mean that less of this first-pass blue light is scattered back into the LED where it may be absorbed, thereby improving package efficiency. This first-pass blue light can then be converted and scattered when it reaches the conversion material layer 56 a second time. This scattering allows for more light to escape from the LED package, while maintaining the proper emission balance between blue and yellow light to achieve the desired color point. The different embodiments can comprise 20-30% less conversion material compared to conventional LED packages. This reduction in conversion material, as well as reduced package size, can result in less costly LED packages with the same or similar emission efficiencies. This arrangement allows for smaller devices, which can also reduce costs.

In some embodiments, the scattering during recycling of the light can also provide additional advantages of a broader emission profile. In most conventional LED packages the emission profile is generally Lambertian with most having an emission profile of approximately 120° FWHM or less. The scattering of light provided in the embodiments of the present invention provide more light emitting from the encapsulant at greater angles than would be experienced in a conventional Lambertian emission profile. In some embodiments, the emission profile can exceed 120 degrees FWHM, while in other embodiments it can exceed 130 degrees FWHM. In still other embodiments the emission profile can be in the range of 130 to 170° FWHM, or 130 to 160° FWHM, or 130 to 150° FWHM in other embodiments. In some embodiments, the emission profile can be greater than 135° FWHM, with some of these embodiments also exhibiting less than 10% color variation at viewing angles of different ranges such as −90 to +90 degrees.

Figure 10:
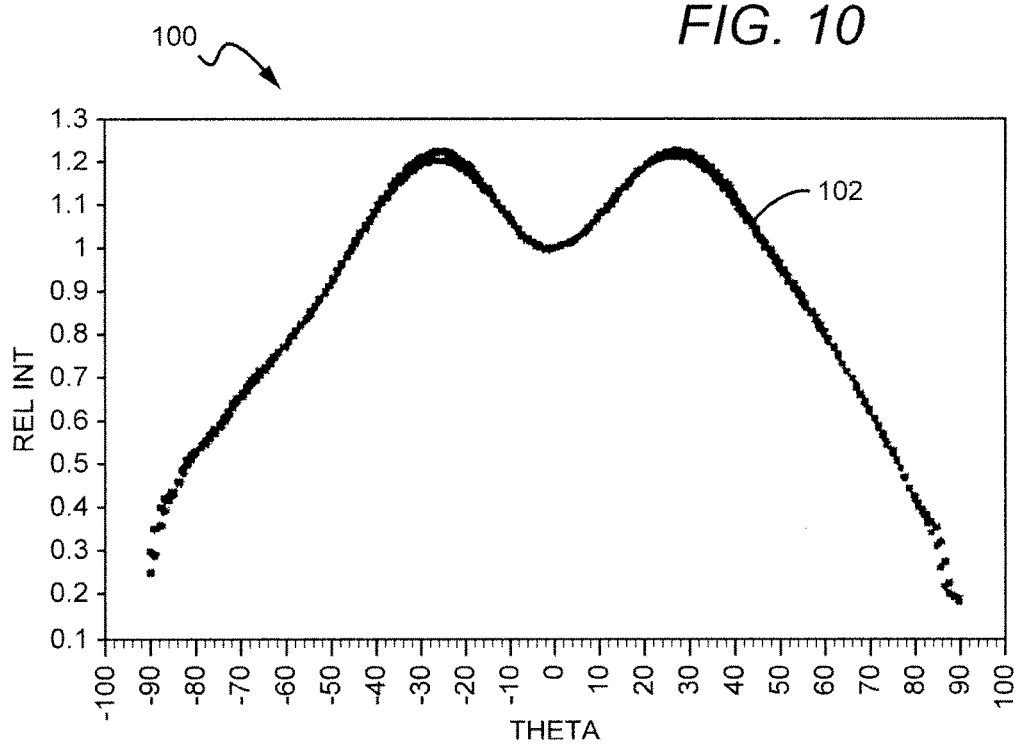
FIG. 10 is an emission profile graph for one embodiment of an LED package according to the present invention.
Figure 10A:
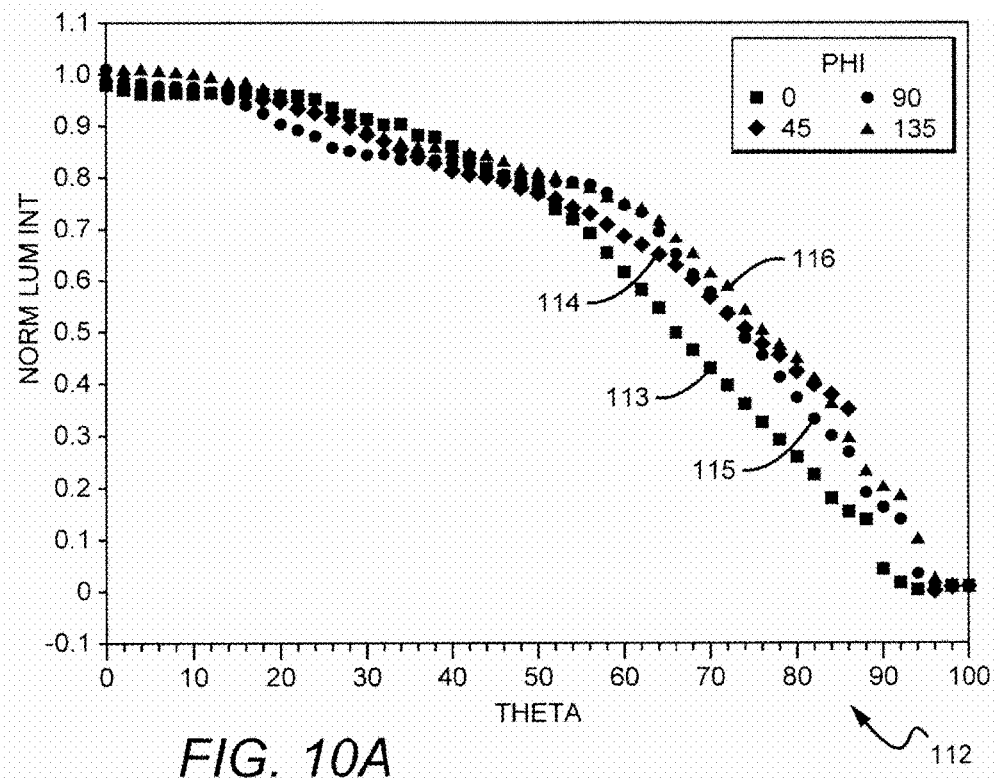
FIG. 10A is another emission profile graph for an LED package according to the present invention.

FIG. 10 is a graph 100 showing an emission profile 102 for one embodiment of an LED package according to the present invention having an emission profile of approximately 150 degrees FWHM. FIG. 10*a* is a graph 112 showing the first emission profile 113 for a LED package according to the present invention when viewing the package from directly above (i.e. 0 degrees) and moving the viewing angle through to approximately 100 degrees. Profiles 114, 115 and 116 show emission profiles starting from 45, 90 and 135 degrees.

As mentioned above, scattering materials may be added to the encapsulant to further increase the width of the emission profile and improve color uniformity with minimal impact on package efficiency. This wider emission profile allows for the LED packages according to the present invention to be particularly applicable to lighting applications needing wider angles of emission, such as area lighting. For LED lighting that relies on mixing chambers to mix light from the LED packages, the broader emission pattern can result in lighting fixtures with reduced mixing chamber depths.

Figure 11:
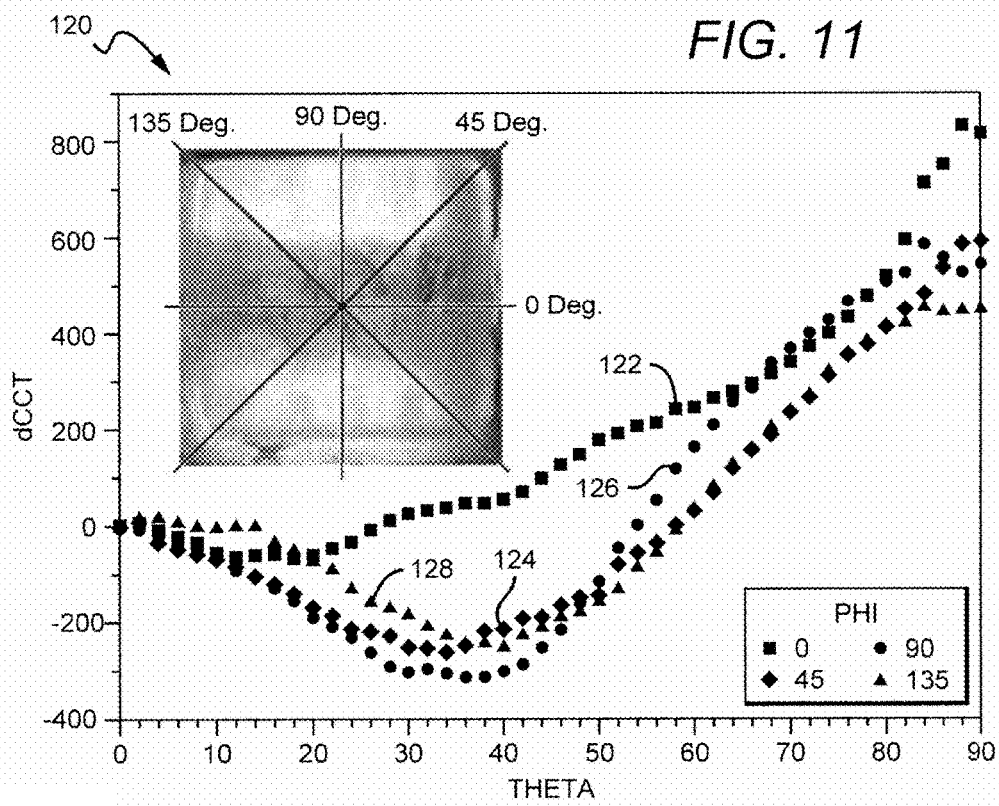
FIG. 11 is a color temperature profile graph for one embodiment of an LED package according to the present invention.

The LED packages according to the present invention can also emit light with more uniform color emission at different viewing angles. In some embodiments, the packages emit light with variations in color temperature of less than −400 to +400 Kelvin and viewing angles of approximately −100 to +100 degrees. In still other embodiments, the variations in color temperature can be less than −300 to +300 Kelvin and viewing angles of approximately −100 to +100 degrees. FIG. 11 is a graph 120 showing variations in color temperature over viewing angle for one embodiment of an LED package according to the present invention. The variations over viewing angles are from −100 to +100 degrees and are generally in the range of −100 to +200 Kelvin. The first emission profile 122 for a LED package according to the present invention when viewing the package from directly above (i.e. 0 degrees) and moving the viewing angle through to approximately 100 degrees. Profiles 124, 126 and 128 show emission profiles starting from 45, 90 and 135 degrees.

The blanketing of the conversion material layer also allows the conversion material layer to act as a remote layer with good thermal spreading. That is, heat generated during the conversion process, or heat from the LED 52 that passes into the conversion material layer 56 can be spread across the conversion material layer 56. The heat can then conduct into the submount 54 and the encapsulant 58 to dissipate into the surrounding ambient. This allows for more efficient dissipation of heat compared to conventional packages having LEDs with conversion material only on the LED.

Some embodiments according to the present invention provide LED packages having smaller footprints compared to conventional LED packages with hemispheric encapsulants, while still emitting with the same or similar efficiency. In some embodiments, the LED package footprint can be less than 3 mm by 3 mm or larger, while in other embodiments it can be 2 mm by 2 mm or larger. In still other embodiments it can be 1 mm by 1 mm or larger with some embodiments according to the present invention be approximately 1.6 mm by 1.6 mm. The LED packages according to the present invention can be scalable to many different larger or smaller sizes. The encapsulants in LED packages according to the present invention can extend up to the edge of the submount, while LED packages with hemispheric encapsulants can have submounts that extend beyond the edge of the encapsulant, thereby increasing the overall size of the package footprint.

The LED package according to the present invention can also provide for efficient light emission for devices with a smaller ratio of LED chip area to LED package footprint. This allows for the edge of the LED chips in the LED arrays to be closer to the edge of the encapsulant to provide greater LED emission area per combined LED package footprint for the array. In some embodiments, the edge of the LED chip array can be approximately at or near the edge of the encapsulant such that the LED package has substantially the same footprint as the LED chip array. In some embodiments, the ratio of LED chip array area to LED package footprint can be less than six, while in other embodiments it can be less than five. In still other embodiments it can be less than four, with some embodiments having a ratio of approximately 3.5. In still other embodiments, the ratio can be less than three.

The LED packages according to the present invention can also have smaller footprints compared to conventional LED packages with hemispheric encapsulants. In some embodiments, the footprint can be less than 12 mm square. In still other embodiments footprint can have an area of less than approximately 9 mm square, less than 6 mm square, or less than 4 mm square. In some embodiments the package can have a footprint area in the range of 1 to 4 mm. In some embodiments the LED package can have an approximately 1.6 mm by 1.6 mm submount, with a footprint area of approximately 2.56 mm square.

In still other embodiments, the submount area for LED packages having multiple LEDs can be as low as the LED area of all the LED chips combined plus 2 times the conversion material layer thickness at the edge of the submount. Different ratios can also be achieved with submounts having different shapes. In other embodiments having multiple LED chips, the ratio of LED chip area to LED package footprint in these embodiments can be as low as approximate 1.046. In still other embodiments, the ratio can be as high as 20 or more. In different embodiments, the ratio can fall in the range of 1 to 20, 1 to 15, 1 to 10, 1 to 5, 1 to 3, or 1 to 2.

Having greater LED area for package footprint can allow for higher packing density. The LED packages can be used in place of conventional LED packages, and for the same amount of area can provide greater LED emission area. In many applications, this allows for driving the same area of LED packages with a lower drive signal to achieve the same emission intensity. This can result in greater emission efficiency. In other embodiments, the same drive current can be used, and the LED packages according to the present invention can be used to generate higher emission intensity. The embodiments according to the present invention provide the flexibility of providing LED package emission with high luminous flux, or with lower luminous flux at greater efficiency.

The embodiments according to the present invention can also have different combinations of footprint ratio dimensions to height dimensions. In some embodiments, the ratio of footprint dimensions can be 1 by 1, with a corresponding height ratio of less than one. In some embodiments the width and length of the submount footprint can be greater that the height of the LED chip or the height of the encapsulant. Some LED package embodiments can have a footprint measuring 1.6 by 1.6, with a height of approximately 1.3 mm, giving dimension ratios of 1 by 1 by approximately 0.8125. In still other embodiments, the ratio of footprint to height can be approximately 1 by 1 by 1 with some embodiments having footprint measuring 1.6 mm by 1.6 mm, and having a height of approximately 1.6 mm. Other embodiments can comprise a ratio of 1 by 1 by greater than 1, and other embodiments can have a dimension of 1 by 1 by greater than 1.5. Still other embodiments can have dimensions of 1 by 1 by greater than 1.5 or greater, or 1 by 1 by 2 or greater, or 1 by 1 by 3 or greater. In packages having non-square submounts, the height of the encapsulant can be greater than the largest submount footprint dimension. For rectangular submounts the height can be greater than the length and width of the submount.

Other embodiments according to the present invention can have different encapsulant heights, with this height being measured from the bottom or top surface of the submount. In some embodiments, the height of the encapsulant can be as low as 0.3 mm to as high as 5 mm or more. In still other embodiments, the encapsulant can be 2 mm high or more. In still other embodiments, it can be 1 mm high or more. It is noted that in some embodiments, the emission pattern of the packages can change with the height of the encapsulant, with some embodiments having a wider emission pattern for higher encapsulants. For example, the in embodiments having a cubic encapsulants, emission pattern for a package having a 0.625 mm high encapsulant (measured from the top surface of the submount) can have an emission pattern that is approximately 8% wider than the same package with a 0.525 mm encapsulant. For a package with a 0.725 mm encapsulant, the emission pattern width can be increased further, up to approximately 5% wide. This increased emission pattern can be realized with higher encapsulants, without significant variations in emission efficiency.

The present invention provides for various combinations of LED shapes and encapulant surface arrangements. The blue emitting LED chips 52*a* can comprise angled surfaces to enhance light emission, that are now provided in combination with an encapsulant having vertical and/or horizontal planar surfaces. The red LED chip 52b is provided with horizontal and vertical surfaces used in combination with horizontal and planar surfaces of the encapsulant. These are only a few of the surface combinations that are provided in different embodiments according to the present invention.

Figure 11A:
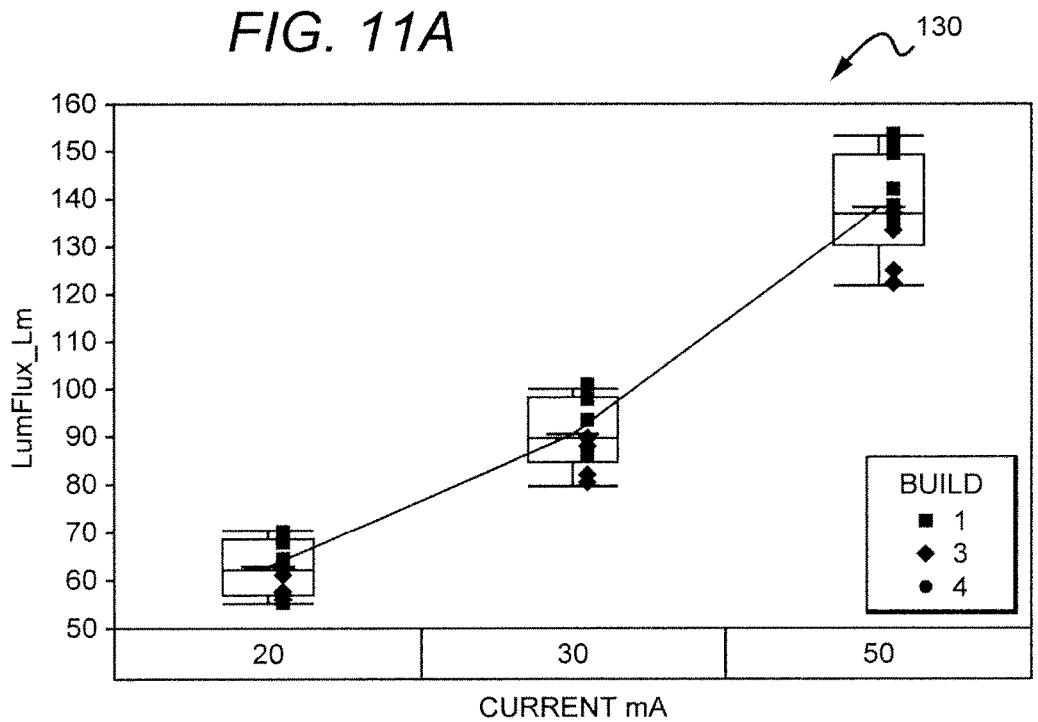
FIG. 11A is a graph showing luminous flux of different LED packages according to the present invention at different input current.
Figure 11B:
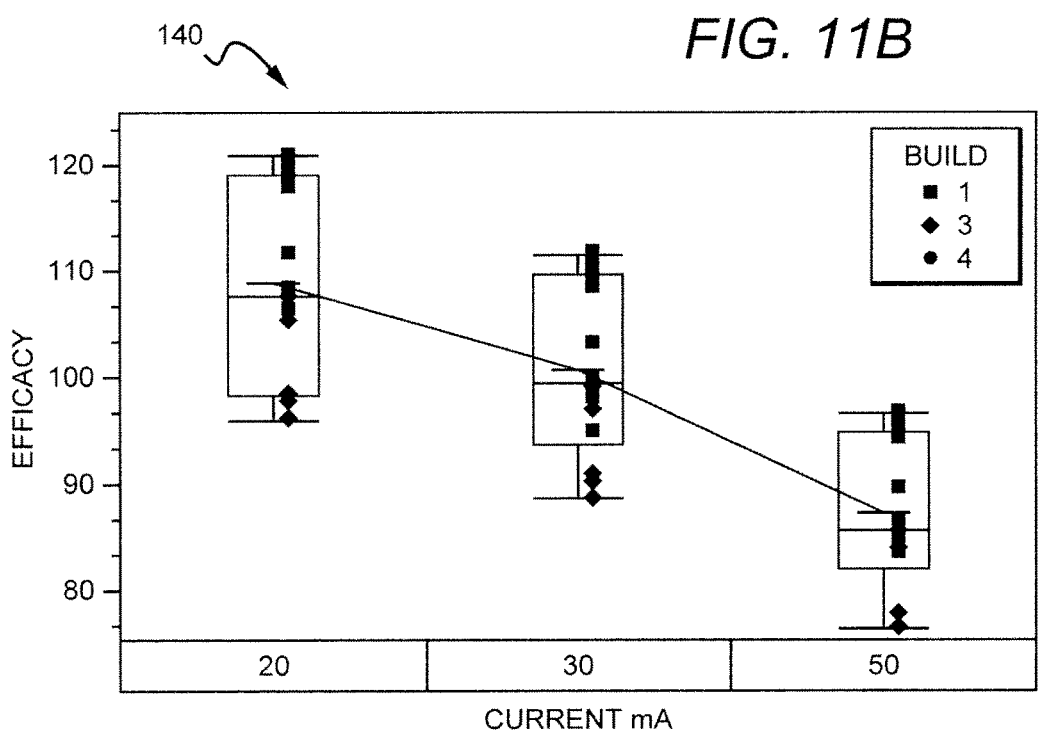
FIG. 11B is a graph showing efficacy of different LED packages according to the present invention at different input current.
Figure 16:
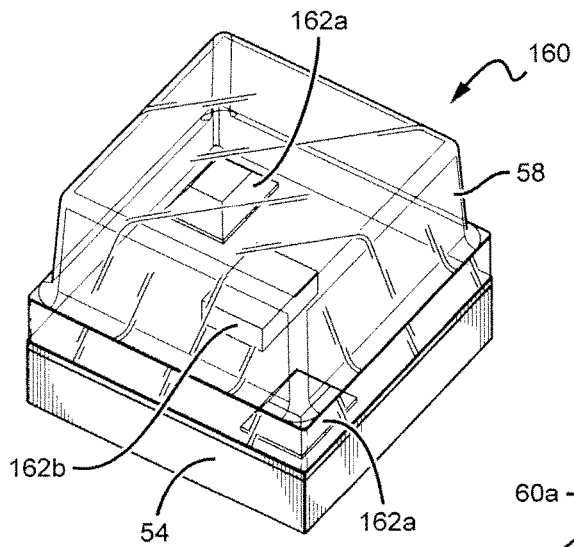
FIG. 16 is a top perspective view of another embodiment of an LED package according to the present invention.
Figure 17:
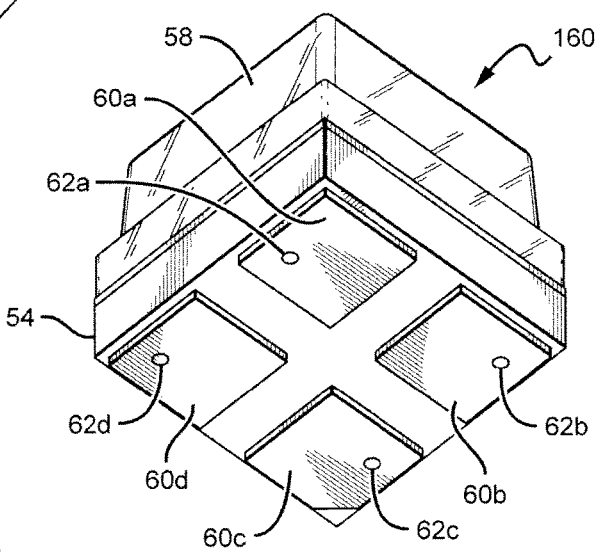
FIG. 17 is a bottom perspective view of the LED package shown in FIG. 16.
Figure 18:
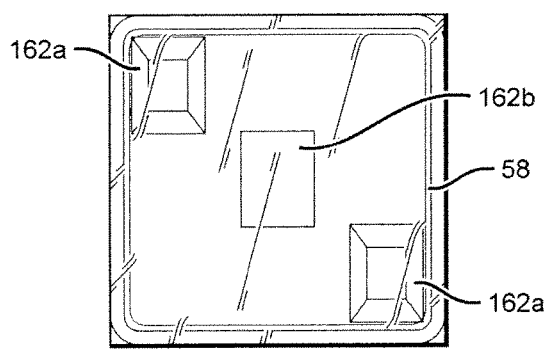
FIG. 18 is a top view of the LED package shown in FIG. 16.
Figure 19:
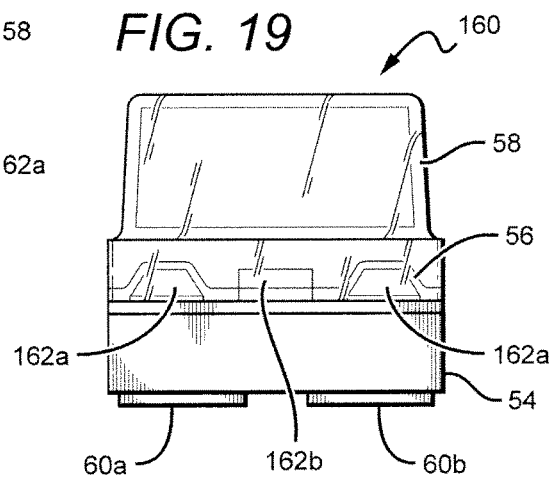
FIG. 19 is a side elevation view of the LED package shown in FIG. 16.
Figure 20:
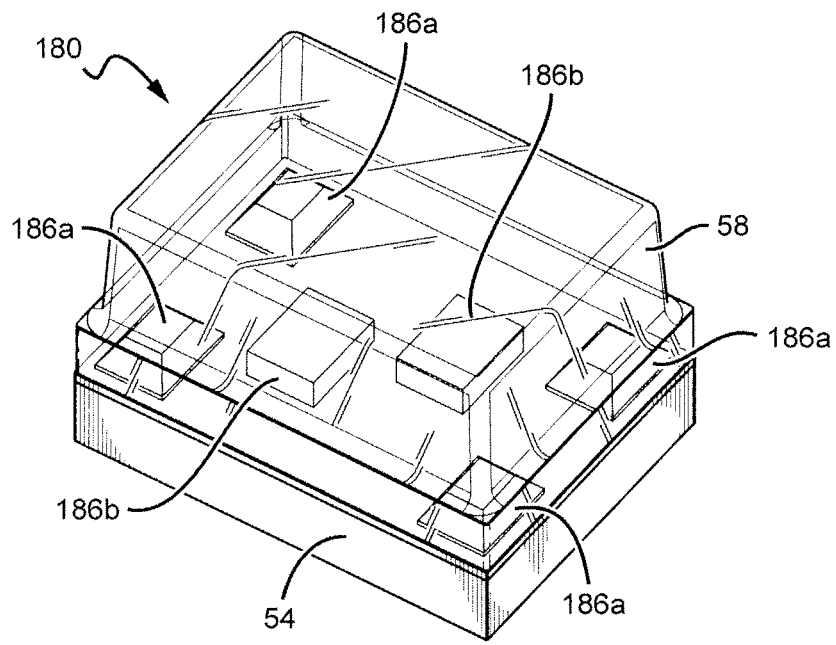
FIG. 20 is a top perspective view of another embodiment of an LED package according to the present invention.
Figure 21:
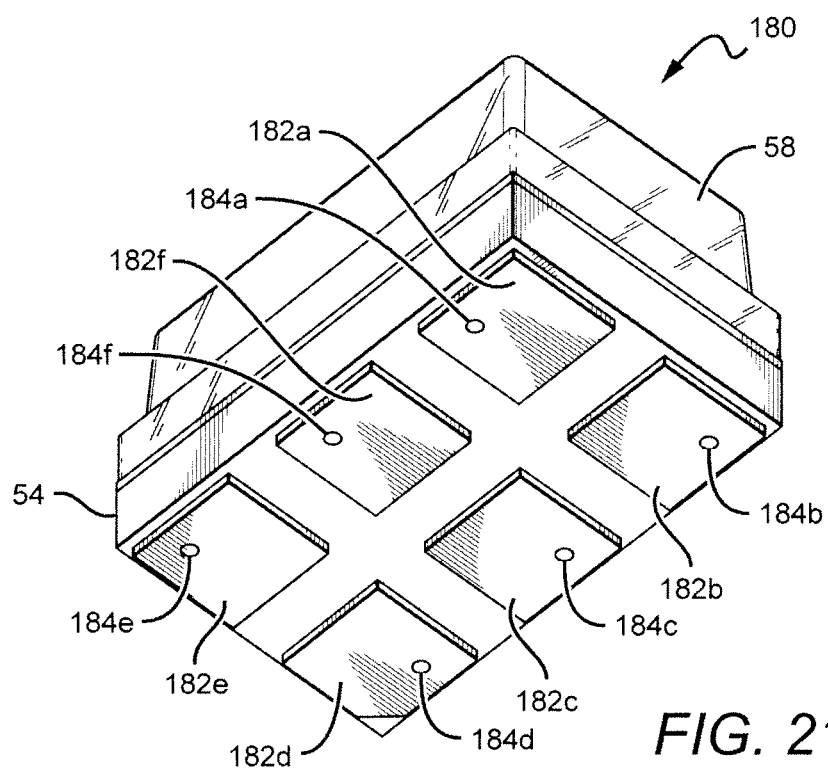
FIG. 21 is a bottom perspective view of the LED package shown in FIG. 20.
Figure 22:
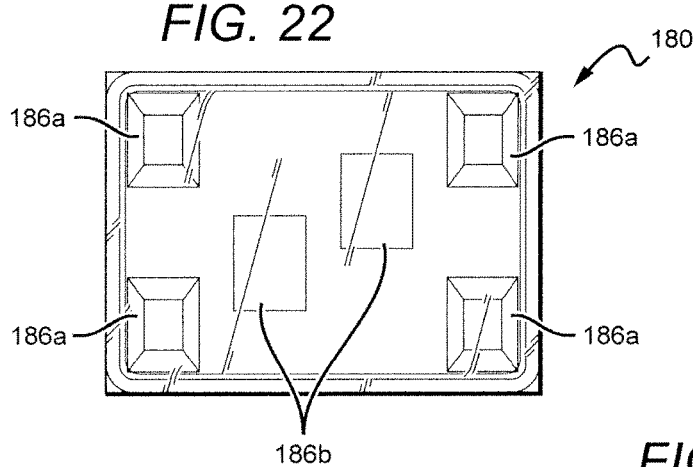
FIG. 22 is a top view of the LED package shown in FIG. 20.
Figure 23:
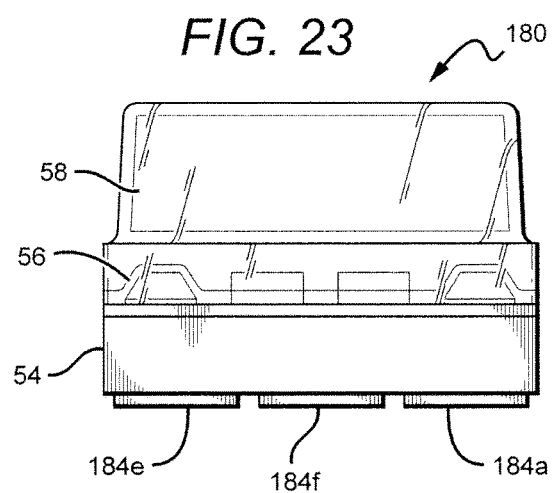
FIG. 23 is a side elevation view of the LED package shown in FIG. 20.

The different LED package embodiments can operate from different drive signals, with some operating from signals as low as 50 mWatts to several tens of Watts. In some embodiments, the drive signal can be in the range of 500 mWatts to approximately 2 Watts. The different embodiments can also provide different luminous flux output, with some embodiments emitting 100 lumens or more. Other embodiments can emit 110 lumens or more, while other embodiments can emit 150 lumens or more. Different embodiments can also emit different color temperatures in the range of 2000 to 6000K, with some embodiments emitting approximately 3000K and others approximately 5000K. By way of example, an LED package according to the present invention having a package footprint of 1.6 by 1.6 mm, can emit approximately 120 lumens at a temperature of 3000K. Other embodiments having the same size can emit 140 lumens at 5000K. The area for the package footprint is 2.56 mm² resulting in emission of 47 lumens/mm² at 3000K, and 55 lumens/mm² at 5000K. Different packages according to the present invention can generally emit in the range of 35 to 65 lumens/mm². Packages that are approximately 1.6 mm tall can have a volume of approximately 4.096 mm³, resulting in operation at approximately 29.27 lumens/mm³ at 3000K and 34.18 lumens/mm³ at 5000K. Different packages according to the present invention can generally emit in the range of 20 to 45 lumens/mm³. This can vary depending on the drive signal (or drive current) but does, however, result in a operation of 115 lumens per Watt (LPW) at 3000K, and 135 LPW at 5000K. Other embodiments having different drive signals can also exhibit similar LPW operation at the same color temperature. The range of LPW for the different embodiments can generally be in the range of 100 to 150 LPW. The LED packages according to the present invention can also exhibit other performance characteristics. FIG. 11a shows a graph 130 showing the luminous flux for different input currents, and FIG. 11b is a graph 140 showing the efficacy for different embodiments according to the present invention in response to different input currents.

As mentioned above, the LED packages according to the present invention can be arranged with different numbers of LEDs arranged in different ways. FIGS. 12 through 15 show another embodiment of an LED package 150 according to the present invention comprising a submount 54, conversion material layer 56, encapsulant 58, solder pads 60a-d and conductive vias 62a-d. This embodiment comprises four blue emitting LEDs 152a, and one red emitting LED 152b mounted to die attach pads on the submount 54. The LEDs 152a, 152b can comprise many different commercially available LEDs mentioned above, with the blue emitting LEDs 152a preferably comprising LEDs from the DA family commercially available from Cree, Inc. In this embodiment, each of the blue emitting LEDs 152a can be arranged at respective one of the corners of the submount 54, with the red emitting LED 152b mounted between the blue emitting LEDs 152 along opposing edges of the submount 54. As with the embodiment above, a conversion material layer is included on the blue LEDs 152a, and the exposed surfaces of the submount 54 and attach pads around the blue LEDs. The red LEDs are not covered by the conversion material layer. This conversion material layer is arranged similar to the same conversion material layer described above, and provides the recycling of TIR light as described above. It is noted that in LED package 150, as well as the other embodiments described herein, the red LED chips may not be covered by the conversion material layer.

The die attach pads (not shown) can be in many different locations, can be made of the same materials as described above and can be deposited using the same methods. As with the embodiment above, during operation electrical signals can be applied to the solder pads 60a-d that are transmitted to the attach pads through the vias 62a-d. The signal is then transmitted to the LEDs 152a, 152b causing them to emit light. The LED package operates in much the same way as LED package 50, and can have the same sizes and ratios described above, In the embodiment shown, the LEDs 152a, 152b are arranged the perimeter, but in other embodiments some of the LEDs can be arranged off the perimeter with some closer to the center of the submount.

The LED packages described herein can have LEDs that are interconnected in many serial and parallel combinations. In the embodiments shown the blue LEDs can be coupled in series, or parallel, or combinations thereof, and for embodiments having multiple red LEDs they can be similarly interconnected. The blue and red LEDs can be separately controlled, with each of the LED types being controlled by a respective electrical signal applied to two of the four solder pads 60 on the backside of the submount 54. That is, different electrical signals can be applied to the solder pads to vary the emission intensity of the blue and red LEDs, to vary the overall emission color of the LED packages according to the present invention. This can allow for changing the LED package emission under different conditions. For example, the human eye may be more sensitive to blue light at nighttime, while it may be more sensitive to green light during the daytime. Independent control allows for the emission of the LED packages to be tuned during the course of the day to meet the varying sensitivity of the human eye. This is only one example of the many different circumstances that may exist that call for varying the emission of the LED packages.

FIGS. 16 through 19 show another embodiment of an LED package 160 according to the present invention comprising a submount 54, conversion material layer 56, encapsulant 58, solder pads 60a-d and conductive vias 62a-d. This embodiment comprises three LEDs and includes two blue emitting LEDs 162a, and one red emitting LED 162b with each of the LEDs mounted to attach pads. The LEDs can be mounted in many different locations with this embodiment having the blue emitting LEDs 162a mounted at opposing corners of the submount 54, and the red LED 162b mounted near the center of the submount 54 between the blue emitting LEDs 162a. As with the embodiments above, the conversion material layer can cover the blue LEDs 162a and the top surface of the submount 54, but not the red LED 162b. The LED package 160 operates in much the same way as the LEDs packages described above, and can have the same size and dimension ratios.

It is understood that different LED package embodiments according to the present invention can have many different shapes with some having fewer or more side surfaces. FIGS. 20 through 23 show an LED package 180 having a rectangular shape, with a submount and encapsulant footprint with two sides that are longer than the remaining two. The LED package can have many different dimensions, with the LED package 180 being otherwise similar to the embodiments above, and can comprise a submount 54, conversion material layer 56, encapsulant 58. In this embodiment, the bottom surface of the submount 54 comprises six solder pads 182*a-f* and conductive vias 184*a-f*. This embodiment further comprises four blue emitting LEDs 186*a*, and two red emitting LED 186*b* mounted to die attach pads on the submount 54. In this embodiment, each of the blue emitting LEDs 186*a* arranged at a respective one of the corners of the submount 54, with the red LEDs 186*b* being mounted such that they are diagonal across between two of the blue emitting LEDs 186*a*. This is only one of the many different ways that the LEDs 186*a*, 186*b* can be mounted in different packages according to the present invention.

The solder pads are arranged in much the same way as the embodiments above, with electric signals applied to the solder pads 182*a-f* being conducted to the LEDs 186*a*, 186*b* through the vias 184*a-f* and the attach pads. In this embodiment, however, three different electrical signals can be applied to provide additional control over the emission of the LEDs 186*a*, 186*b*. In some embodiments, subsets of the blue or red LEDs 186*a*, 186*b* can be controlled by different signals to separately vary the emission of the subsets.

It is noted that in multiple LED package embodiments, it may be advantageous to place the LEDs as close as possible to the edge of the submount, such as the blue emitting LEDs. This may be particularly true when using the LED packages in a linear arrangement such as in a LED based fluorescent lighting tube arrangement. For example, for the three LED embodiments described herein, it may be advantageous to place the blue LEDs at opposing corners on the submount, while LED packages having four LEDs can have an LED at each of the corners of the submount.

Figure 24:
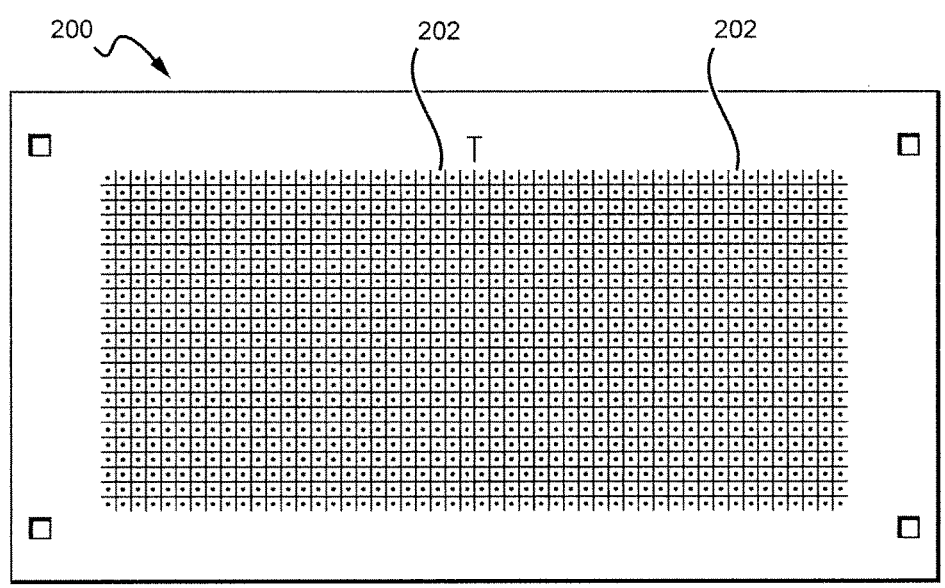
FIG. 24 is a top view of one embodiment of an encapsulant mold according to the present invention.
Figure 25:
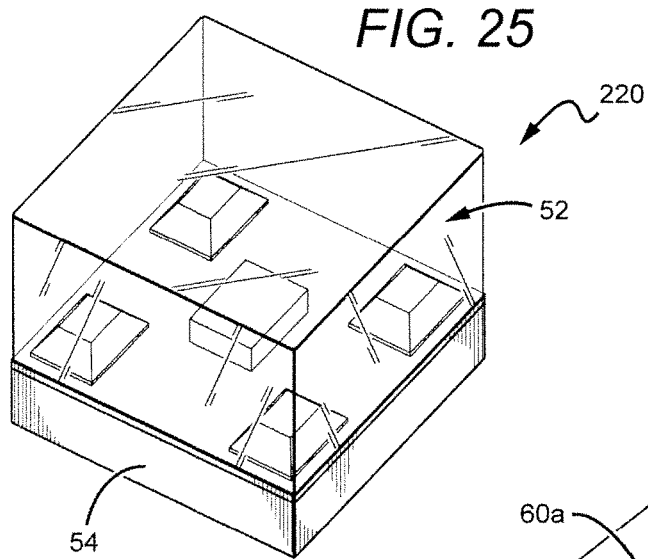
FIG. 25 is a top perspective view of another embodiment of an LED package according to the present invention.
Figure 26:
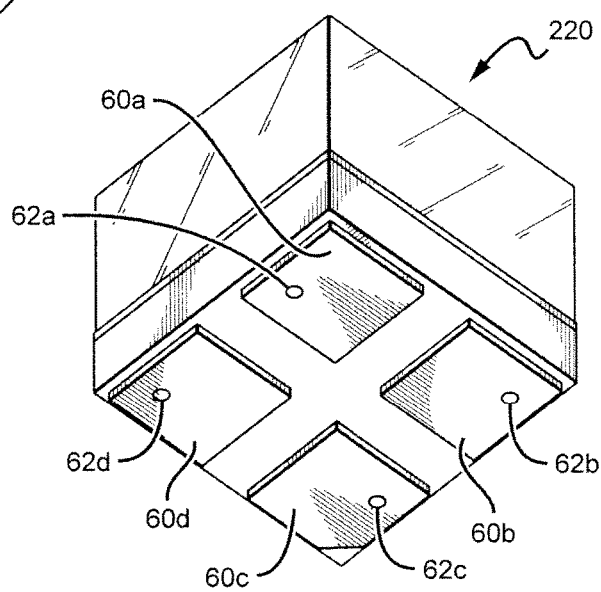
FIG. 26 is a bottom perspective view of the LED package shown in FIG. 25.
Figure 27:
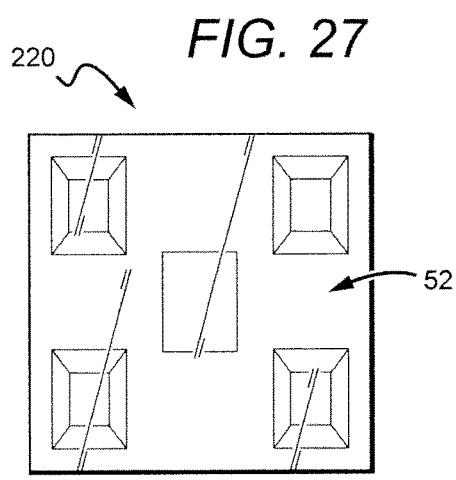
FIG. 27 is a top view of the LED package shown in FIG. 25.
Figure 28:
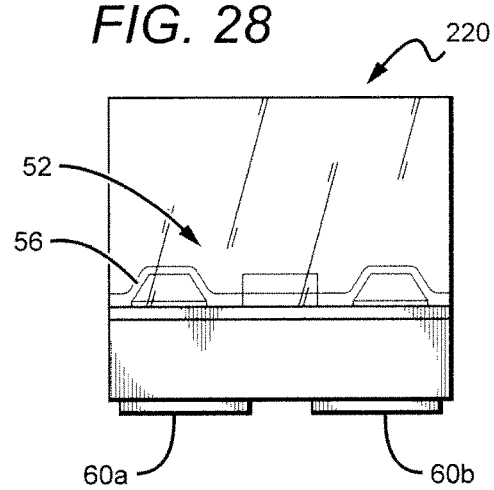
FIG. 28 is a side elevation view of the LED package shown in FIG. 25.

As mentioned above, the encapsulant can be formed in the LED packages according to the present invention using different methods, with some embodiments using different molding processes. One such molding process is referred to as compression molding wherein a mold is provided having a plurality of cavities each of which has an inverted shape of the lens. FIG. 24 shows one embodiment of a mold 200 with a plurality of cavities 202. During molding of the lenses, a submount panel is provided that can have an area approximately the same as that covered by the cavities 202. It is understood that submounts covering less than all the cavities can also be used. The submount panel can comprise a plurality of multiple LEDs and each of the cavities 202 is arranged to align with a respective one of the LEDs (or a set of LEDs) on the submount panel. The mold is loaded with an encapsulant material in liquid form filling the cavities, with some embodiments utilizing a liquid curable silicone. The submount panel can be moved toward the cavity with each of the sets of multiple LEDs being embedded in the liquid silicone in a respective one of the respective cavities. The liquid silicone can then be cured using known curing processes. The panel can then be removed from the mold and the panel can comprise a plurality of encapsulants in the shape of the cavities, each of which is over a respective one of the LEDs. The individual LED packages can then be separated or singulated from the submount panel, using known techniques.

Referring again to the embodiments described above, and by way of example the LED package 50 shown in FIGS. 4 to 8, a small encapsulant connection section 69 can be included at the base of the encapsulant 58. This is a byproduct of the molding process. The cavities in the molding process may not extend to the top surface of the submount 54, thereby leaving the encapsulant section between adjacent ones of the LED packages. The singulation process cuts through the connection section 69 and the submount 54 when separating the LED packages. This connection section can be much thinner, and in some embodiments may not be included.

It is understood that other fabrication processes can be used with one such process comprising covering of a submount panel and its LEDs with a layer of encapsulant material. The individual LED packages can then be separated by different methods such as dicing or cutting through the encapsulant and submount. The resulting packages can have encapsulant side surfaces that are approximately vertical and aligned with the edges of the submount. FIGS. 25 through 28 show another embodiment of an LED package 220 according to the present invention comprising a LEDs 52. submount 54, conversion material layer 56, solder pads 60*a-d* and conductive vias 62*a-d*. In this embodiment, the sidewalls of the encapsulant do not have the connection section, and are essentially aligned with the outer edge of the submount 54 and are vertical. This arrangement can be the result of coating and dicing fabrication process, with the side surfaces being smooth to promote TIR within the encapsulant. In still other embodiments, the encapsulants can be separately molded and then attached to the submount over phosphor conversion material layer. It is understood that the surfaces of the encapsulants can be smoothed or further shaped using different methods, such a cutting, grinding, sanding or etching.

The surfaces should be smooth enough such that the LED is clearly visible through the encapsulant. Stated differently, there is little or no roughness on the surface of the encapsulant to obscure or redirect the light rays passing through the encapsulant. In some embodiments where there is some texturing, roughness or imperfections on the surfaces of the encapsulant, either intentionally included or the result of manufacturing processes. For these embodiments, it can be preferable that these surface features be of the size that does not significantly scatter light. In some embodiments, surface features of sizes having a root mean square (RMS) close to or greater than the wavelength of light encountering the surface. Feature sizes having an RMS greater than the wavelength of light tend to scatter less light, while feature sizes having an RMS less than the wavelength of light tend to scatter more of the light. For embodiments where blue light encounters the surface, the surface features can have an RMS of or greater than approximately 500 nanometers, to minimize scattering. This RMS value can change depending on the wavelength of light encountering the encapsulant surface.

Figure 29:
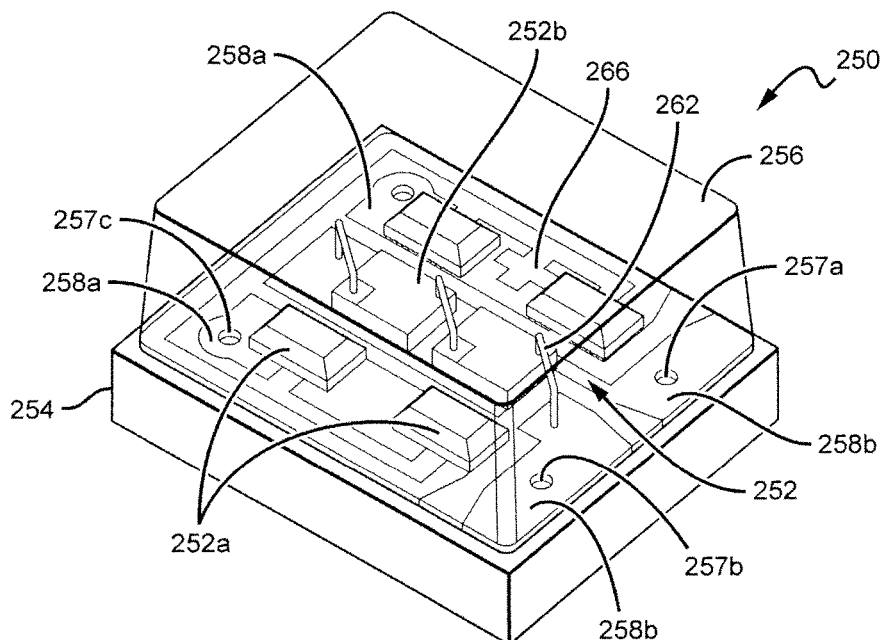
FIG. 29 is a top perspective view of another embodiment of an LED package according to the present invention.
Figure 30:
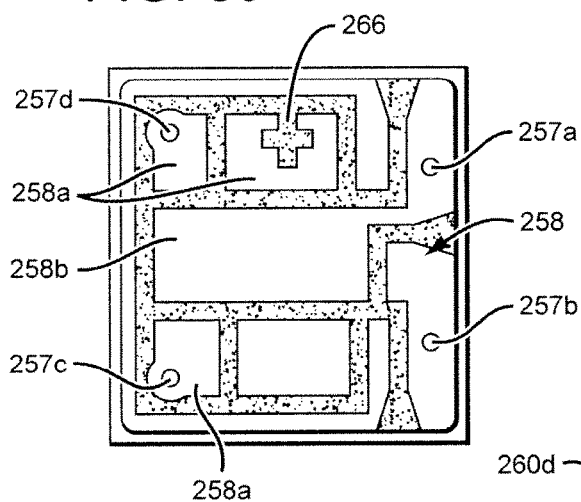
FIG. 30 is a top view of die attach pads in the LED package shown in FIG. 29.

FIG. 29 shows another embodiment of a LED package 250 according to the present invention having six LEDs 252, a submount 254, and an encapsulant 256, and vias 257*a-d*. FIG. 30 shows the die attach pads 258 for the package 250, and FIG. 31 shows the solder pads 260*a-d* for the package 250. The encapsulant 256 can be made of the same materials and arranged in the same ways as the encapsulants described above. Referring to FIG. 29, the LEDs 252 can comprise four blue emitting LEDs 252*a*, and two red emitting LEDs 252*b*, which can be commercially available LEDs such as those described above. Two of the blue emitting LEDs 252*a* can be arranged along one edge of the sumbount 254, and the other two along the opposing submount edge. The two red emitting LEDs 252*b* are arranged between the two sets of blue emitting LEDs 252*a*. The LED package can comprise a conversion material layer as described above that covers the blue LEDs 252*a*, and the exposed surfaces of the submount 254 and the attach pads 258, but not the red LEDs 252b. The conversion material is not shown in this embodiment to allow for ease of description of the die attach pads 258.

The vias 257a-d are electrically conductive paths between the attach pads 258 and the solder pads 260, through the submount 254. Referring to FIGS. 29, 30 and 31, a first set of attach pads 258a are arranged to interconnect the blue LEDs 252a in series and to apply a signal from third and fourth solder pads 260c, 260d to the blue LEDs 252a, with the signal passing though third and fourth vias 257c, 257d to the attach pads 258b. Each of the blue LEDs 252a spans a space between adjacent portions of the attach pads 258a with the electrical signal passing through each of the blue LEDs 252a. A second set of attach pads 258b is arranged to apply an electrical signal from first and second solder pads 260a, 260b to the red LEDs 252b. The signal can be conducted through the first and second vias 257a, 257b to the red LED 252b that are serially interconnected with the attach pads 258b and wire bonds 262. It is noted that in the embodiment shown, the red LEDs 252b can have insulating substrates, such that an electrical signal applied to the red LEDs 252b does not pass into the portion of the attach pads 258b below the LEDs, and a electrical signal on these attach pads 258b does not pass into the red LED chips 252b, except through the wire bonds 262.

Figure 34:
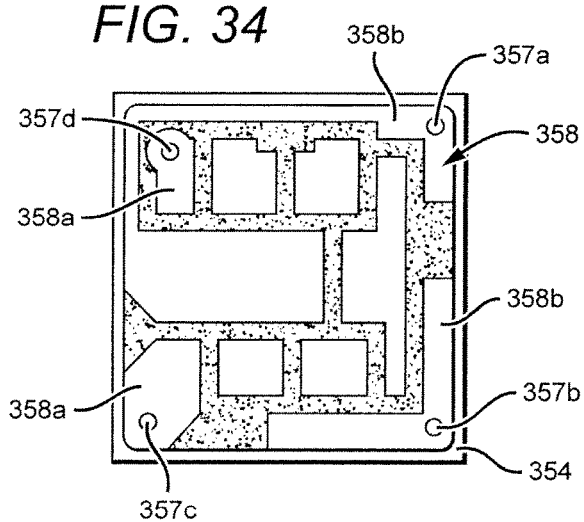
FIG. 34 is top view of a conventional LED carrier tape.

The LED package 250 can also comprise polarity indicator as described above, with different embodiments having the indicator in different locations. Referring now to FIG. 31, polarity indicators can be included in the form of notches 264a, 264b in the corners of the second and third solder pads 260b, 260c. These notches 264a, 264b that can be detected with up-looking cameras on automated pick-and-place equipment during manufacturing. In the embodiment shown, the notches 264a, 264b can be on the inner corners of the pads so that they are near the center of the submount 254. Referring now to FIG. 34, a conventional LED package carrier tape 300 is shown that comprises holes 302 beneath each of the LED packages it carries. The one or both of the notches 264a, 264b in the area of the submount 54 near the center can be visible through hole 302 in the carrier tape 300. This allows for the notch (and the corresponding LED package polarity) to be visible and verified carrier tape hole 302 without removing the LED package from the carrier tape 300.

The notches 264a, 264b can have many different shapes beyond V-shaped, such as U-shaped, I-shaped, W-shaped, square shaped, rectangular shaped, star shaped, plus shaped, minus shaped, etc. The notches can also be included in many different locations on the solder pads 260a-d as further described above, and can similarly be detected by the camera of conventional pick and place equipment. It is noted that other types of polarity indicators can be used, such as holes of different shapes or other cutouts in the solder pads, and in other embodiments the LED packages can have indicators in other locations, such as on the submount 54.

The LED package 250 can also comprise a polarity indicator on the top of the submount that can be comprise many of the different shapes described above. In the embodiment shown, the top polarity indicator an comprise a plus sign 266 is the die attach pads 258.

Figure 32:
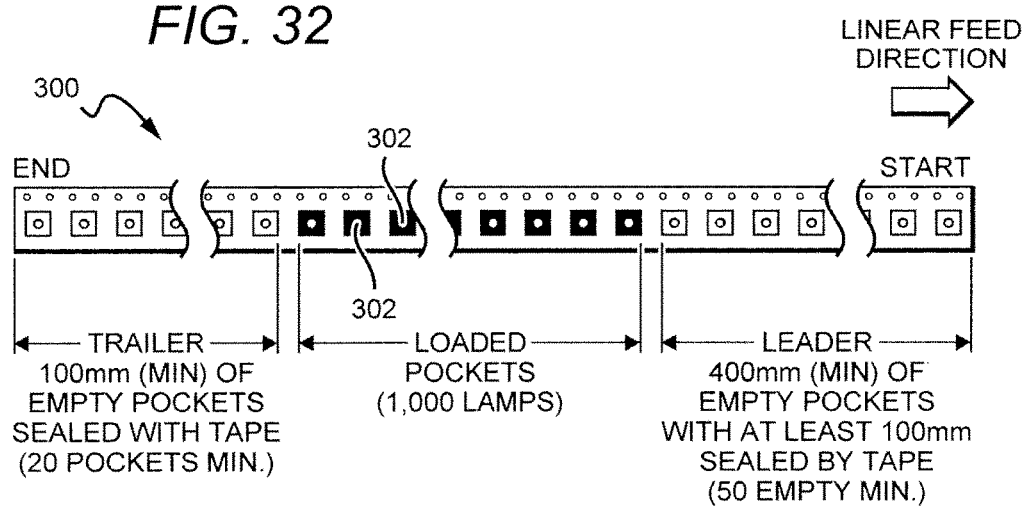
FIG. 32 is a top perspective view of another embodiment of an LED package according to the present invention.
Figure 33:
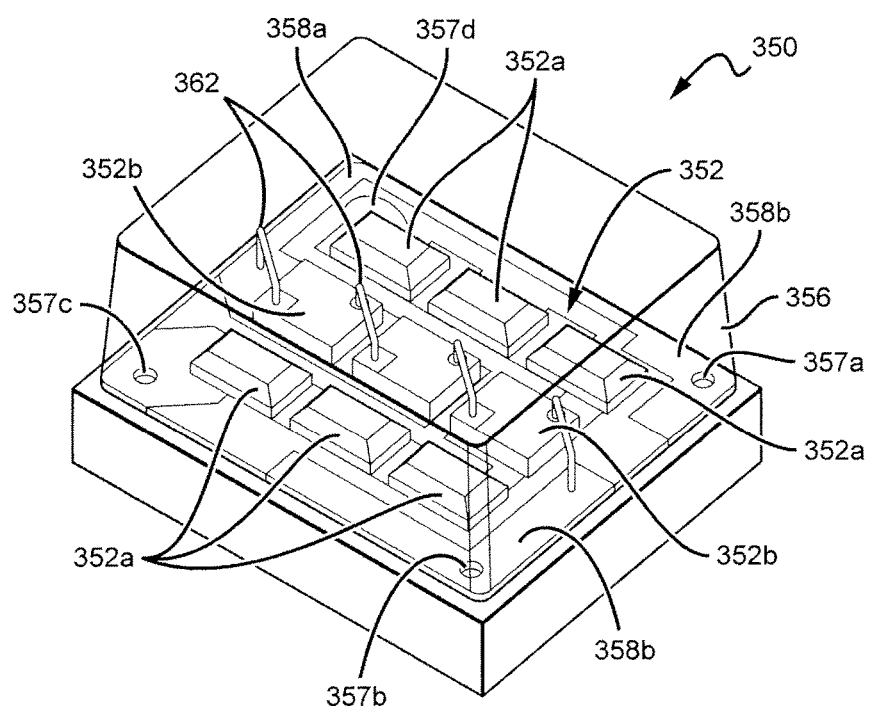
FIG. 33 is a top view of die attach pads in the LED package shown in FIG. 32.

FIG. 33 shows still another embodiment of an LED package 350 according to the present invention that is similar to the LED package 250 described above. This embodiment comprises nine LEDs 352, a submount 354, an encapsulant 356, and vias 357a-d. FIG. 34 shows the die attach pads 358 for this embodiment, with the solder pads being the same as those shown in FIG. 28. The LEDs 352 shown in FIG. 32 can comprise six blue emitting LEDs 352a, and three red emitting LEDs 352b. Three of the blue LEDs 352a are along one edge of the submount 354, with the remaining three along the opposite edge. The three red LEDs 352b are arranged between the two sets of blue LEDs 352a. Referring now to FIGS. 33 and 34 in combination, like above the blue LEDs are mounted to the mounted to the first set of die attach pads 358a and are serially interconnected. As signal applied to solder pads 260c, 260d is conducts to the blue LEDs 352a causing them to emit light. The red LEDs are also connected in serial between the second set of die attach pads 358b and through wire bonds 362. A signal applied to solder pads 260a, 260b is conducted to the attach pads 358b and is conducted through the red LEDs 352b along wire bonds 362. It is noted that a portion of the first die attach pads 358a passes under one of the red LEDs 352b, but in this embodiment the bottom of the red LEDs 352b is electrically insulating so that electrical signals will not pass between the red LED 352b and the portion of the attach pads 358a.

Figure 35:
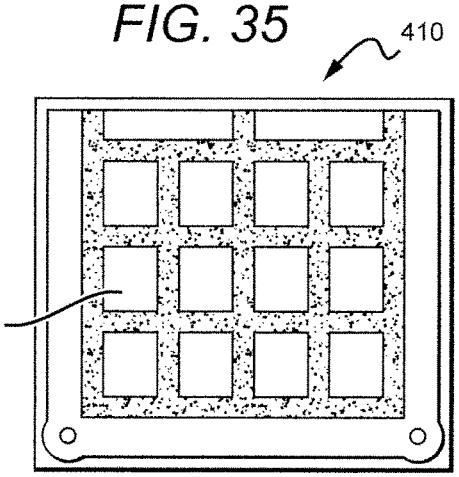
FIG. 35 is a top view of another submount according to the present invention.
Figure 36:
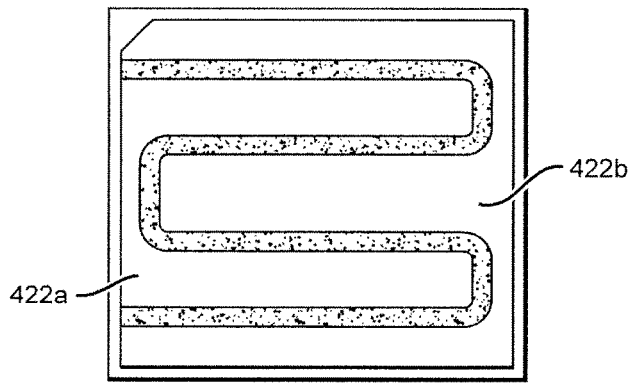
FIG. 36 is a top view of another submount according to the present invention.

Other embodiments can be arranged to hold even more LEDs. FIG. 35 shows still another embodiment of a submount 410 having a die attach pattern 412 that can be used to connect up to sixteen LEDs (not shown) in series, with each of the LEDs being mounted across the space between adjacent elements of the pattern. The pattern can be used to for mounting different LEDs emitting different colors of light. In embodiments utilizing 3 volt LEDs, a 48 volt drive signal can be used. Like above, this driver signal can be higher or lower, depending on the voltage and number of LEDs mounted to the submount. FIG. 36 shows still another embodiment of an submount 420 comprising a first U-shaped attach pad 422a, interdigitated with a second W-shaped attach pad 422b such that up to 16 LEDs can be connected in parallel. As with the embodiment above, each of the LEDs can be mounted across the space between the first and second attach pads 422a, 422b. Using 3 volt devices, this package can utilize a 3 volt drive signal, with this signal being higher or lower as discussed above.

The embodiments above have been described with reference to certain embodiments arranged in different ways, but it is understood that different features described above can be utilized in different packages arranged in different ways. For example, the features above can be used in packages similar to those commercially available from Cree, Inc., including but not limited to the XLampCX, XLampM and XLampX family of LED packages.

The LED packages described above can be used in many different lighting applications or luminaires using a single LED package or multiple LED packages. In lighting applications using multiple conventional LED packages, a mixing chamber can be needed to mix the light from the LED packages, particularly in those embodiments utilizing LED packages emitting different colors of light that are then mixed to provide the desired color of light. In some of these conventional lighting applications, the minimum depth of the mixing chamber can be approximately the same as the distance between LED packages emitting the same color of light. The use of mixing chambers adds to both the cost and complexity of conventional luminaires.

Figure 37:
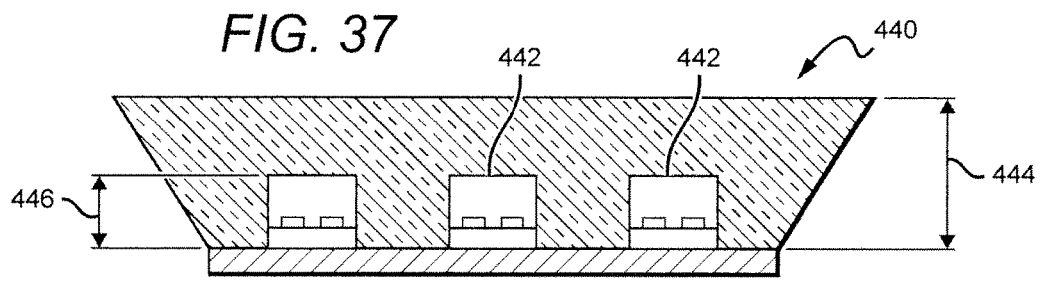
FIG. 37 is a sectional view of one embodiment of a mixing chamber according to the present invention.

In luminaires using LED packages according to the present invention, much of the mixing takes place within the LED packages. As a result, for some of these applications the mixing chamber can be eliminated, but in other embodiments, the mixing chamber may be included for aesthetic reasons and to assist in mixing the colors. In these arrangements, the depth of the mixing chamber can be greatly reduced. FIG. 37 shows one embodiment of a luminaire mixing chamber 440 having LED packages 442 arranged according to the present invention. The mixing chamber 440 can have a height 444 and the LED packages can have a height 446, and in some embodiments the mixing chamber height 444 can be less than four times the height of the LED packages 442. In other embodiments it can be less than three times the height of the LED packages. In other embodiments it can be less than 1.5 times the height of the LED packages. Providing luminaires without mixing chambers or with mixing chambers having a reduced depth can result in lower cost, less complex, thinner and/or smaller luminaires.

The packages according to the present invention can serve as the light source for lamps such as those described in U.S. patent application Ser. No. 13/034,501, to Le et al., entitled "Solid State Lamp", and U.S. patent application Ser. No. 13/028,946, to Le et al., entitled "High Efficacy LED Lamp With Remote Phosphor and Diffuser Configuration", both incorporated herein by reference.

The LED packages can also be used in troffer type lamp fixtures such as those described in U.S. patent application Ser. No. 13/368,217 to Pickard et al., entitled "Multiple Panel Troffer Style Light Fixture", and U.S. patent application Ser. No. 12/873,303, Edmond et al., entitled "Troffer-Style Fixture", both incorporated herein by reference.

The LED packages can also be used in many other lighting applications such as LED displays, LED street lighting, residential LED downlighting, etc. Some LED package embodiments of the present invention are particularly applicable to fluorescent tube replacement LED lighting with the emission pattern of the LED packages being desirable for linear arrays such as those used in fluorescent tube replacements.

The LED packages can be arranged with many different features beyond those described above. Some embodiments can comprise electrostatic discharge (ESD) protection elements or devices. Others of the LED packages can be arranged with secondary optics to further disperse, spread or columnate the package beam profile. In still other embodiments, different ones of the LEDs within the package can be mounted higher than others of the LEDs to provide the desired LED package emission pattern.

Although the embodiments above are described herein with reference to LED packages with conversion material layers, it is understood that other embodiments can be provided without a conversion material layer. Some of these embodiments can comprise an encapsulant with one or more planar surfaces along with a blue, red or green LED chip by itself to provide LED packages emitting blue, red or green light. Other embodiments can also comprise multiple LED chips emitting different colors of light such as red, green or blue emitting LEDs, or red green, blue and white emitting LEDs. These are only some of the combinations that are possible in different embodiments according to the present invention. The LED packages can be arranged with many additional features, such as adaptors to allow for handling and mounting of these relatively small packages.

The LED packages can be arranged with many additional features, such as adaptors or connectors to allow for handing and mounting of these relatively small packages. The different LED package embodiments can comprise different markings or other features to assist in alignment, or the mounting area can have marks or features to assist in alignment and mounting of the LED packages.

Although the present invention has been described in detail with reference to certain preferred configurations thereof, other versions are possible. The invention can be used in any light fixtures where a uniform light or a near uniform light source is required. In other embodiments, the light intensity distribution of the LED module can be tailored to the particular fixture to produce the desired fixture emission pattern. Therefore, the spirit and scope of the invention should not be limited to the versions described above.

We claim:

1. An emitter package, comprising:
first and second solid state light sources on a submount;
a conversion material layer covering said first solid state light source and substantially all the top surface of said submount, wherein said conversion material layer conformally coats said first solid state light source;
an encapsulant over said conversion material layer, said encapsulant comprising two or more planar surfaces;
wherein said second solid state light source is uncovered by said conversion material layer.

2. The emitter package of claim 1, wherein said solid state light sources comprise a plurality of light emitting diodes (LEDs), at least some of which are emitting different colors of light.

3. The emitter package of claim 2, wherein at least one of said LEDs comprises a 3 dimensional geometry of the light emitting surfaces.

4. The emitter package of claim 2, wherein at least one of said LEDs comprises a geometry with entirely or partially oblique facets on one or more surfaces.

5. The emitter package of claim 2, wherein said light sources emit a white light combination of light.

6. The emitter package of claim 2, wherein at least one of said LEDs emits red light and at least one of said LEDs emits blue light.

7. The emitter package of claim 6, wherein said at least one blue emitting LED is covered by said conversion material layer.

8. The emitter package of claim 6, wherein said at least one red emitting LED is uncovered by said conversion material layer.

9. The emitter package of claim 1, wherein said solid state light sources comprise at least one solid state laser.

10. The emitter package of claim 1, wherein said encapsulant comprises a planar top surface and planar side surfaces.

11. The emitter package of claim 1, wherein said encapsulant comprises a horizontal planar surface and a vertical planar surface.

12. The emitter package of claim 1, wherein said planar surfaces cause TIR of at least some light from said solid state light sources.

13. The emitter package of claim 2, wherein at least some of said LEDs are connected in series.

14. The emitter package of claim 2, wherein at least some of said LEDs are connected in parallel.

15. The emitter package of claim 2, wherein said LEDs are connected in a series and parallel combination.

16. The emitter package of claim 1, wherein said encapsulant comprises a flat top and vertical sidewalls comprising planar surfaces.

17. The emitter package of claim 1, wherein said encapsulant shape is from the group consisting of cubic, polygon, prismatic, cylindrical, triangle, pentagon, hexagon and octagon.

18. The emitter package of claim 1, wherein said encapsulant comprises a horizontal surface and vertical surfaces numbering in the range of 3 to 12.

19. The emitter package of claim 1, comprising an emission pattern greater than 120° full width at half maximum.

20. The emitter package of claim 1, comprising an emission pattern greater than 135 full width at half maximum, with less than 10% color variation at viewing angles between −90 and +90 degrees.

21. The emitter package of claim 1, further comprising a polarity indicator.

22. The emitter package of claim 1, wherein at least some light is emitted from said two or more planar surfaces of said encapsulant when at least one of said solid state light sources is operating.

23. The emitter package of claim 1, comprising a submount footprint area of less than 12 mm square.

24. The emitter package of claim 1, wherein the ratio of the submount footprint to the solid state light source footprint is in the range of just over 1 to approximately 20.

25. The emitter package of claim 1, wherein said submount comprises a footprint dimension ratio of approximately 1 by 1, with said package having a corresponding footprint dimension to package height ratio in the range of approximately 0.5 to 5.

26. The emitter package of claim 1, further comprising a plurality of die attach pads on said submount.

27. The emitter package of claim 26, wherein said solid state light sources comprise a plurality of LEDs on said die attach pads in series.

28. The emitter package of claim 26, wherein said solid state light sources comprise a plurality of LEDs on said die attach pads in parallel.

29. The emitter package of claim 26, wherein said solid state light sources comprise a plurality of LED chips on said die attach pads in a series and parallel combination.

30. The emitter package of claim 1, comprising more than two solder pads.

31. The emitter package of claim 1, further comprising two or more solder pads, wherein at least one of said solder pads comprises a polarity indicator.

32. The emitter package of claim 31, further comprising die attach pads, with said solder pads on the submount face opposing said die attach pads.

33. The emitter package of claim 1, wherein said solid state light sources emit at least two different colors of light, and where said different emitting light sources are independently controllable.

34. The emitter package of claim 33, further comprising solder pads, wherein individual or groups of said different color emitting solid state light sources are connected to a dedicated set of solder pads.

35. The emitter package of claim 34, wherein the emission of said groups of different color emitting solid state light sources is controlled to a desired color point via said solder pads.

36. The emitter package of claim 34, wherein the emission of said groups of different color emitting solid state light sources is controlled via said solder pad connections to be at a specified white color point at or near the black body locus in the CIE diagram.

37. An emitter package, comprising: multiple solid state light sources on a submount;
 an encapsulant on said submount, said encapsulant comprising one or more planar surfaces; and
 a blanket conversion material layer over substantially all of said submount and which conformally coats a plurality of surfaces of at least some of said solid state light sources, said blanket conversion material layer between said submount and said encapsulant;
 wherein at least one of said multiple solid state light sources is not covered by said blanket conversion material layer.

38. The emitter package of claim 37, said encapsulant comprising a plurality of planar surfaces, wherein at least some light is emitted from said plurality of planar surfaces of said encapsulant and widens the emission profile of said emitter package.

39. An emitter package of claim 37, wherein said solid state light sources comprise either LEDs or lasers or both.

40. The emitter package of claim 38, wherein said emission profile exceeds 120 degrees full width at half maximum (FWHM).

41. The emitter package of claim 38, wherein said emission profile exceeds 130 degrees full width at half maximum (FWHM).

42. The emitter package of claim 38, wherein said emission profile is in the range of 130 to 170 degrees full width at half maximum (FWHM).

43. The emitter package of claim 38, wherein said emission profile is in the range of 130 to 160 degrees full width at half maximum (FWHM).

44. The emitter package of claim 38, wherein said emission profile is in the range of 130 to 150 degrees full width at half maximum (FWHM).

45. The emitter package of claim 38, wherein said emission profile is approximately 150 degrees full width half maximum (FWHM).

46. The emitter package of claim 38, wherein said emission profile is greater than 135 degrees full width half maximum (FWHM), with less than 10% variation in color at −90 to +90 degree viewing angles.

47. The emitter package of claim 37, wherein at least some light reflected within said encapsulant can escape the encapsulant.

48. The emitter package of claim 37, emitting light with variations in color temperature of less than −300 to +300 Kelvin and viewing angles of approximately −100 to +100 degrees.

49. The emitter package of claim 37, emitting light with variations in color temperature of less than −400 to +400 Kelvin and viewing angles of approximately −100 to +100 degrees.

50. The emitter package of claim 37, emitting light with variations in color temperature of less than approximately −200 to +200 Kelvin and viewing angles of approximately −100 to +100 degrees.

51. The emitter package of claim 37, wherein said blanket conversion material is over substantially all exposed surfaces of said submount.

52. The emitter package of claim 37, wherein said encapsulant is substantially cube shaped.

53. The emitter package of claim 37, wherein said submount comprises a footprint area of less than 12 mm square.

54. The emitter package of claim 37, wherein said footprint comprises an area of less than approximately 6 mm square.

55. The emitter package of claim 37, wherein said footprint comprises an area in the range of 1 to 4 mm square.

56. The emitter package of claim 37, wherein said footprint is approximately 2.56 mm square.

57. The emitter package of claim 37, wherein the ratio of the submount footprint to the solid state light source footprint is in the range of just over 1 to approximately 20.

58. The emitter package of claim 57, wherein said ratio is in the range of just over 1 to approximately 15.

59. The emitter package of claim 57, wherein said ratio is in the range of just over 1 to approximately 10.

60. The emitter package of claim 57, wherein said ratio is in the range of just over 1 to approximately 5.

61. The emitter package of claim 37, wherein said submount comprises a footprint dimension ratio of approximately 1 by 1, with a corresponding footprint dimension to package height ratio in the range of approximately 0.5 to 5.

62. The emitter package of claim 61, wherein said footprint dimension ratio is approximately 1 by 1, with a corresponding footprint dimension to package height ratio in the range of approximately 0.5 to 2.

63. The emitter package of claim 37, wherein said encapsulant comprises a height in the range of approximately 0.3 mm to 5 mm.

64. The emitter package of claim 63, wherein said encapsulant comprises a height in the range of approximately 0.3 mm to 2 mm.

65. The emitter package of claim 37, wherein an increased height of said encapsulant produces a wider emission pattern of said emitter package.

66. An emitter package, comprising:
a plurality of solid state light sources on a submount, at least two of said plurality of solid state light sources emitting different colors of light, wherein said different emitting solid state light sources are separately controllable to control the emission intensity;
a conversion material layer which conformally coats at least some of said solid state light sources and on substantially all of said submount wherein at least one of said plurality of solid state light sources is not covered by said conversion material layer; and
an encapsulant on said submount, said encapsulant comprising a plurality of planar surfaces;
wherein at least some light is emitted from said plurality of planar surfaces of said encapsulant when at least one of said solid state light sources is operating.

67. The emitter package of claim 66, wherein said light sources comprise LEDs, lasers or both.

68. The emitter package of claim 66, accepting at least two electrical signals.

69. The emitter package of claim 68, wherein each one of said two electrical signals can control the emission intensity of one of said different emitting light sources.

70. The emitter package of claim 68, comprising four or more solder pads.

71. The emitter package of claim 66, wherein said different emitting light sources comprise red emitting light sources and blue emitting light sources.

72. The emitter package of claim 66, wherein said different emitting light sources comprise red emitting light sources and violet to UV emitting light sources.

73. The emitter package of claim 71, wherein said conversion material layer covers said blue emitting light sources.

74. The emitter package of claim 73, wherein said conversion material layer converts at least some of said blue light to yellow light.

75. The emitter package of claim 74, wherein said conversion material layer does not cover said red emitting LEDs.

76. The emitter package of claim 75, emitting a white light combination of red, blue and yellow light.

77. The emitter package of claim 72, wherein said conversion material layer converts at least some of said violet to UV light to blue and/or yellow light.

78. The emitter package of claim 77, wherein said conversion material layer does not cover said red emitting LEDs.

79. The emitter package of claim 78, emitting a white light combination of red, blue and yellow light.

80. An emitter package, comprising:
multiple solid state light sources on a submount;
an encapsulant on said submount, said encapsulant comprising a plurality of planar surfaces; and
a blanket conversion material layer over substantially all of said submount and which conformally coats at least some of said solid state light sources, wherein at least one of said multiple solid state light sources is not covered by said blanket conversion material layer, said blanket conversion material layer between said submount and said encapsulant, wherein said blanket conversion material layer comprises a maximum thickness of 100 microns or less;
wherein at least some light is emitted from said plurality of planar surfaces of said encapsulant when at least one of said solid state light sources is operating.

81. A solid state luminaire, comprising:
a solid state light source comprising a plurality of emitter packages, one or more of said packages comprising:
first and second solid state light sources on a submount;
a blanket conversion material layer on substantially all of said submount and which conformally coats said first solid state light source; and
an encapsulant over said blanket conversion material layer, said encapsulant comprising two or more planar surfaces;
wherein said second solid state light source is uncovered by said blanket conversion material layer.

82. The emitter package of claim 37, wherein said conversion layer comprises a maximum thickness of 100 microns or less.

83. The emitter package of claim 37, wherein the thickness of said conversion layer is substantially uniform.

84. The emitter package of claim 1, wherein said two or more planar surfaces are emission surfaces.

85. The emitter package of claim 1, wherein said conversion material layer is adjacent said second solid state light source.

86. The emitter package of claim 1, wherein said conversion material layer is on at least one side surface of said second solid state light source.

87. The emitter package of claim 1, wherein said conversion material layer abuts said second solid state light source.

88. The emitter package of claim 1, wherein the height of said second solid state light source is greater than the thickness of said conversion material layer.

89. The emitter package of claim 1, wherein said second solid state light source is on an attach pad.

90. The emitter package of claim 89, wherein said conversion material layer is on a portion of said attach pad beyond the edge of said second solid state light source.

91. The emitter package of claim 89, wherein said conversion material layer is on a portion of said attach pad around said second solid state light source.

92. The emitter package of claim 89, wherein said conversion material layer is on all of said attach pad beyond the edge of said second solid state light source.

93. The emitter package of claim 89, wherein said conversion material layer covers a portion of said attach pad beyond the edge of said second solid state light source.

94. The emitter package of claim 1, wherein said conversion material layer is on a portion of the top surface of said submount around said second solid state light source.

\* \* \* \* \*